United States Patent
Mercado

[19]

[11] Patent Number: 5,986,824
[45] Date of Patent: Nov. 16, 1999

[54] LARGE NA PROJECTION LENS SYSTEM WITH APLANATIC LENS ELEMENT FOR EXCIMER LASER LITHOGRAPHY

[75] Inventor: Romeo I. Mercado, Fremont, Calif.

[73] Assignee: Nikon Corporation, Tokyo, Japan

[21] Appl. No.: 09/090,510

[22] Filed: Jun. 4, 1998

[51] Int. Cl.⁶ ........................................................ G02B 9/64
[52] U.S. Cl. ........................................... 359/754; 359/649
[58] Field of Search ..................... 359/364–366, 359/754, 755, 756, 649

[56] References Cited

U.S. PATENT DOCUMENTS

| | | | |
|---|---|---|---|
| 4,770,477 | 9/1988 | Shafer | 350/1.2 |
| 4,812,028 | 3/1989 | Matsumoto | 359/366 |
| 4,891,663 | 1/1990 | Hirose | 355/53 |
| 4,948,238 | 8/1990 | Araki | 350/469 |
| 4,964,704 | 10/1990 | Shinohara | 350/433 |
| 5,142,409 | 8/1992 | Hanzawa et al. | 359/355 |
| 5,260,832 | 11/1993 | Togino et al. | 359/679 |
| 5,323,263 | 6/1994 | Schoenmakers | 359/366 |
| 5,448,408 | 9/1995 | Togino et al. | 359/651 |
| 5,519,537 | 5/1996 | Shikama | 359/649 |
| 5,555,479 | 9/1996 | Nakagiri | 359/355 |
| 5,636,000 | 6/1997 | Ushida et al. | 355/30 |

*Primary Examiner*—Scott J. Sugarman
*Attorney, Agent, or Firm*—H. Donald Nelson; Debra A. Chun

[57] ABSTRACT

Projection lens systems for transferring a pattern on a reticle onto a wafer having an aplanatic lens element. The aplanatic lens element has a shape factor between 0.1 and 0.224, the projection lens system satisfies the condition:

$-2.0 < f_{ap}/F < -0.6251$, where $f_{ap}$ is the focal length of the aplanatic lens element and F is the focal length of the projection optical lens system. The projection optical lens system further satisfies the condition $2.6 < |f_{G3}/f_G| < 4.64$.

9 Claims, 18 Drawing Sheets

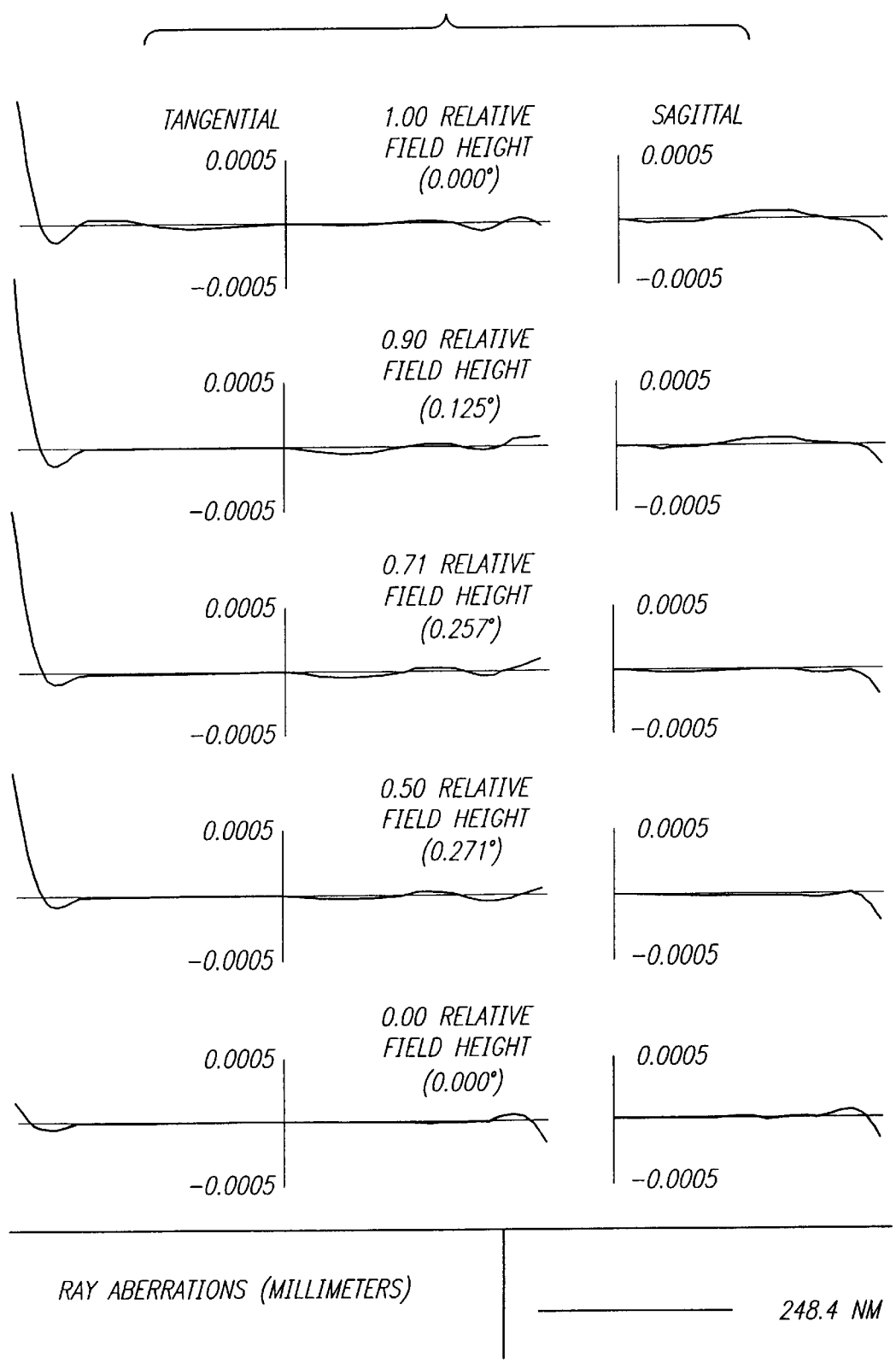

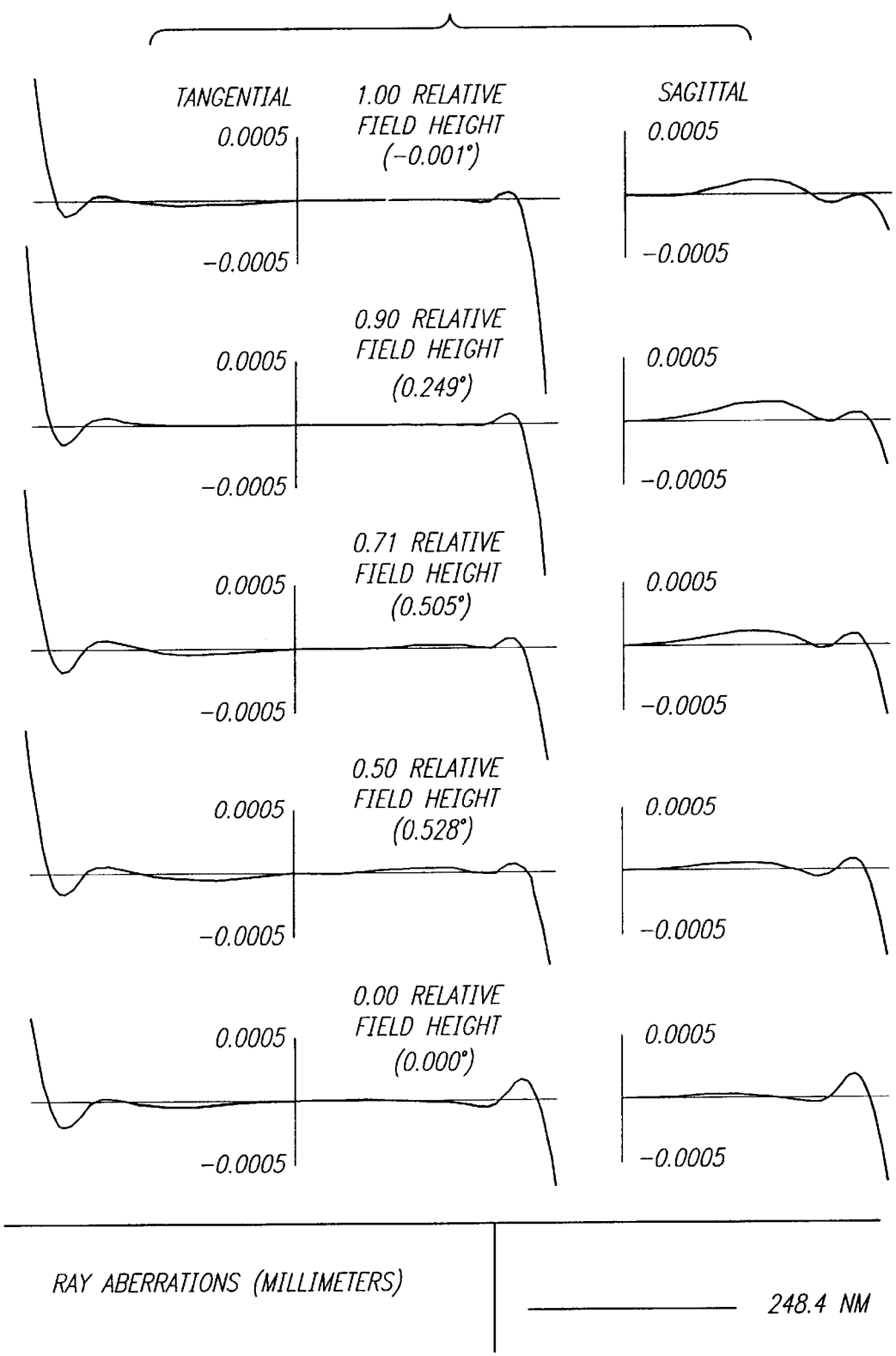

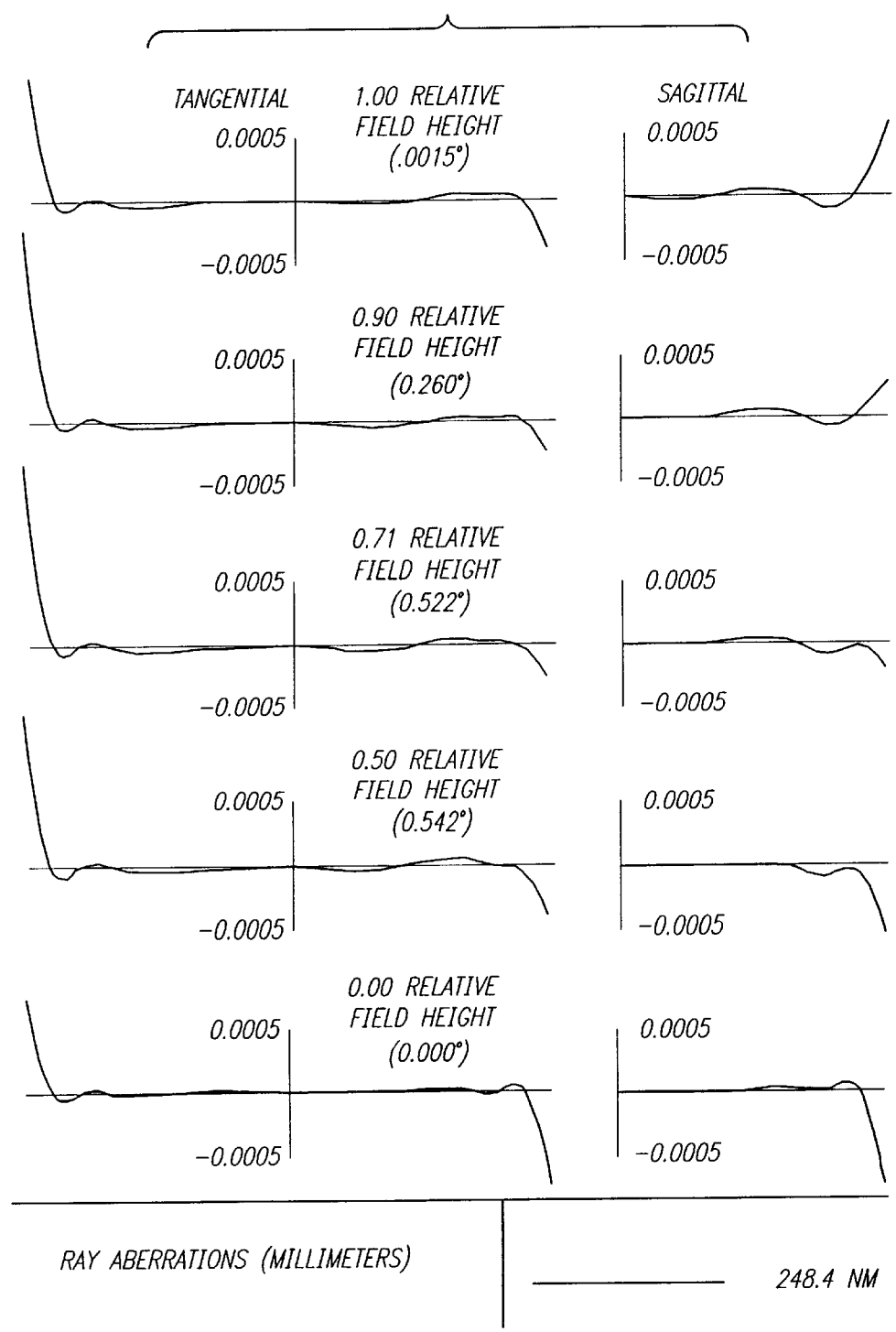

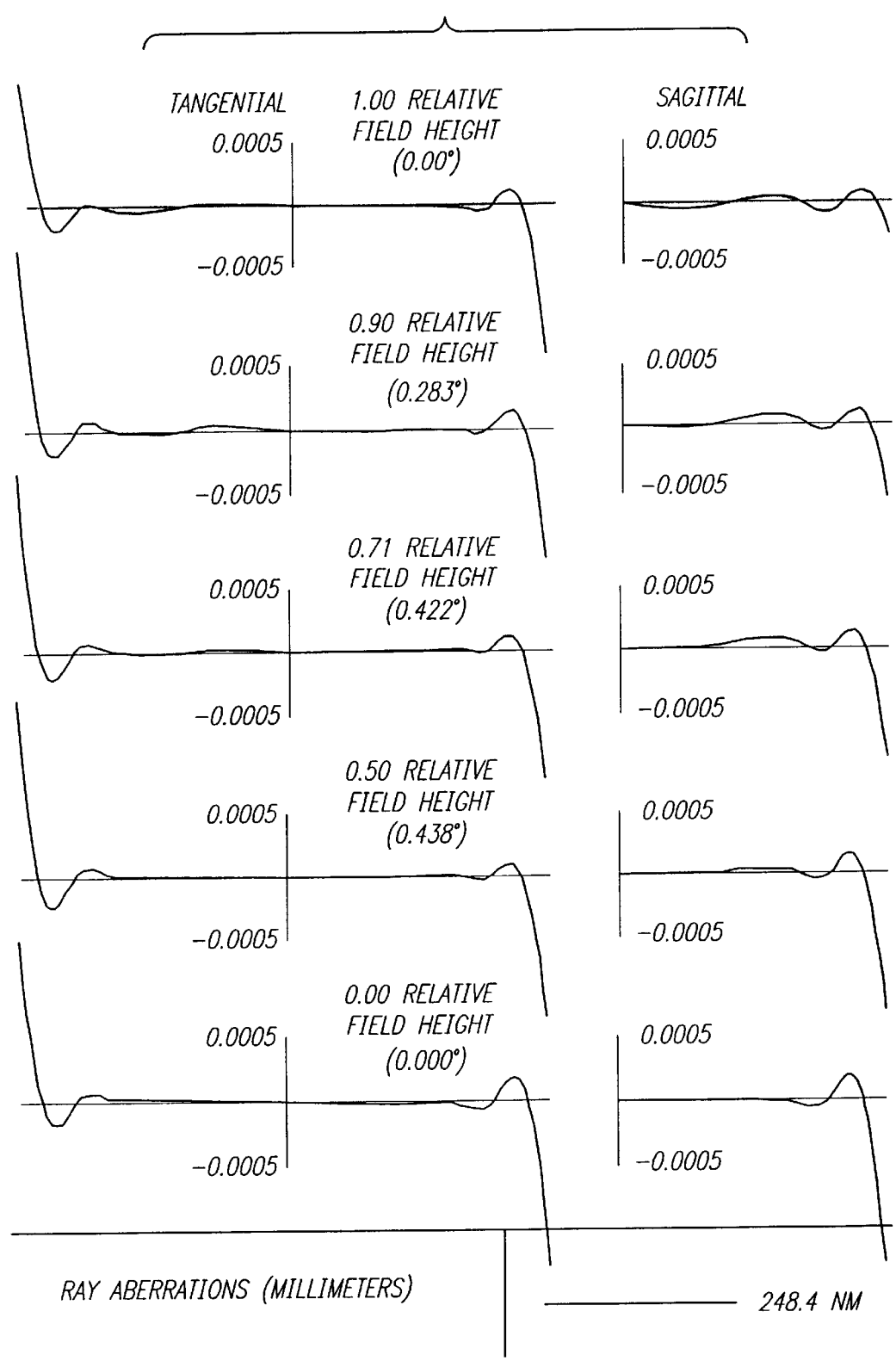

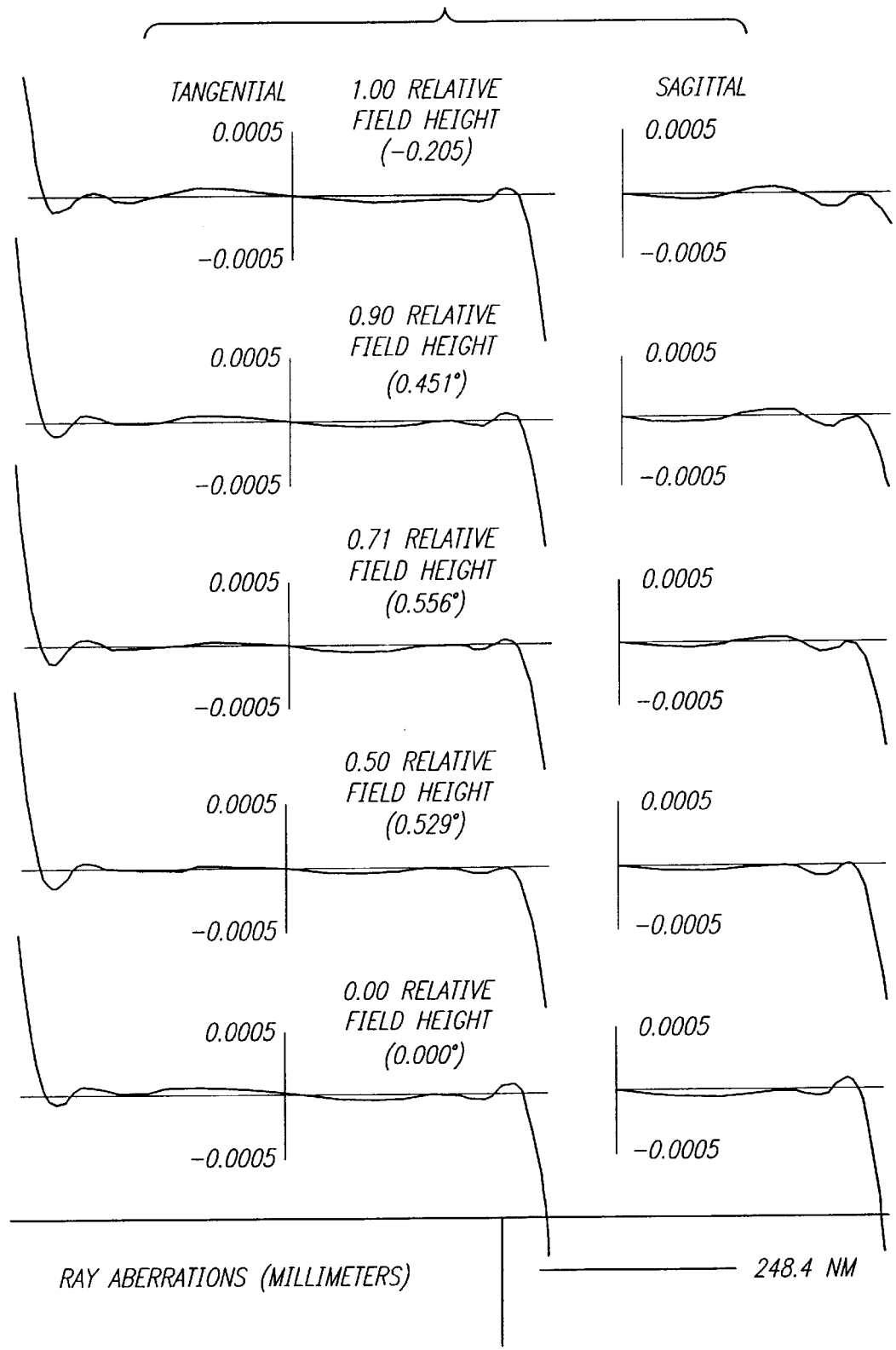

LARGE NA PROJECTION LENS SYSTEM WITH APLANATIC LENS ELEMENT FOR EXCIMER LASER LITHOGRAPHY

1. FIELD OF THE INVENTION

This invention relates generally to projection lens systems for excimer laser exposure lithography in which a pattern formed on a mask or reticle is transferred onto a substrate such as a semiconductor wafer or glass plate. More particularly, the present invention is directed to projection lens systems for excimer laser exposure lithography in which the lens systems have large numerical apertures and large exposure field sizes with good aberration correction.

2. BACKGROUND OF THE INVENTION

In semiconductor device manufacturing, projection optical systems are used to transfer integrated circuit (IC) patterns such as large scale integrated (LSI) circuit patterns from a reticle, also known as a mask, onto a wafer or semiconductor substrate upon which the semiconductor device is to be formed. Because of the difference in the relative sizes of the reticle and the resulting semiconductor device, such as a die or semiconductor chip, the projection optical system must be a reduction projection optical system.

Modem integrated circuits are becoming more integrated; that is, more and more functions are being integrated into circuits that are to be included in a single die. At the same time, however, there is a major effort not to allow the die to grow in size in order to maintain or improve the performance and speed of the semiconductor device being manufactured. To maintain the die at the same or reduced size, the reduction projection optical system must have a wider exposure area and higher resolution.

The drive toward higher density circuitry in microelectronic devices has increased interest in a variety of high-resolution lithographic techniques that produce finer resolution patterns at high production rates. The resolution of a lithographic optical lens system is a function of the exposure wavelength and the numerical aperture of the projection lens system. The resolution or minimum resolvable feature size is directly proportional to wavelength and inversely proportional to the numerical aperture, as follows (a lower value for resolution indicates better resolution):

resolution=$k\lambda/NA$ where k is a proportionality constant, $\lambda$ is the exposure wavelength and NA is the numerical aperture. One method to achieve better resolution of the optical system is to illuminate the reticle with shorter wavelength illumination and/or to use a projection lens system with a higher numerical aperture. In principle, the shorter the wavelength and/or the higher the numerical aperture of the projection lens system, the better the resolution. In the search for shorter wavelength illumination sources, there have been identified several excimer lasers that can be used as illumination sources for semiconductor photolithography, including the KrF excimer laser with a wavelength of 248.4 nanometers and the ArF excimer laser with a wavelength of 193 nanometers. These excimer lasers have replaced the traditional illumination sources that have been used for semiconductor manufacturing such as the deuterium lamp or the xenon-mercury arc lamp. The xenon-mercury arc lamp supplies the g-line that has a wavelength of 436 nanometers and the I-line that has a wavelength of 365 nanometers. These two spectral lines have been the mainstay illumination used in semiconductor wafer manufacturing.

One of the advantages of using an excimer laser as an illumination source is that the excimer laser can produce an average power of several watts at a number of wavelengths. The high brightness of the excimer laser light source can either be used to obtain extremely fast exposures or a significantly smaller numerical aperture can be used in the projection lens system and still obtain reasonable exposure times. A smaller numerical aperture results in a larger depth of focus that increases quadratically with the inverse of the numerical aperture. One advantage of a larger depth of focus permits larger tolerances in wafer distortion and focus that lead to better lithographic patterns.

The excimer gas selected for use in the excimer laser may include only one gas, in which case the output is at the wavelength that is characteristic of the single excimer gas. The choice of which excimer gas to use depends on several factors, such as the characteristics of the photoresist being used in the semiconductor manufacturing process. For example, the KrF excimer gas produces an illumination output at 248.4 nanometers that is suitable for exposing photoresists such as novolak resin sensitized with a diazo ketone.

Because an excimer laser has sufficient power at a single wavelength, another major advantage associated with using an excimer laser is that the aberration correction is simplified because the optics can be designed for a single wavelength. Because a single wavelength is used in a particular lens system means, for example, that chromatic aberration problems would be minimized.

As the integrated circuits (ICs) have become more sophisticated, the projection optical systems utilized to transfer the circuit patterns onto the semiconductor wafers or other receptive substrates (e.g., glass plates, etc.) have been required to achieve higher and higher performance levels. These higher performance levels include achieving higher resolution and the maintenance of high levels of aberration correction or the achieving of higher levels of aberration correction at large exposure field areas.

Accordingly, there is a need for projection optical systems that achieve high resolution, maintain high levels of aberration correction and have large exposure field areas.

SUMMARY OF THE INVENTION

According to the present invention, the foregoing and other advantages are attained by a projection exposure apparatus having an aplanatic lens element. The shape factor of the aplanatic lens element satisfies the following condition:

$0.1 < (R_1-R_2)/(R_1+R_2) < 0.224$, where $R_1$ is the radius of curvature of the lens surface that faces the reticle side of the optical lens system and $R_2$ is the radius of curvature of the lens surface that faces the image side of the optical lens system.

In one aspect of the present invention, the projection optical lens system satisfies the following condition:

$-2.0 < f_{ap}/F < -0.6251$, where $f_{ap}$ is the focal length of the aplanatic lens element and F is the focal length of the projection optical lens system.

In another aspect of the present invention, the projection optical lens system comprises four groups of lens elements with the aplanatic lens element in the fourth group of lens elements.

In still another aspect of the present invention, the projection optical lens system satisfies the following condition:

$$2.6<|f_{G3}/f_{G2}|<4.64,$$

where $f_{G2}$ is the focal length of the second group of lens elements and $f_{G3}$ is the focal length of the third group of lens elements.

In still a further aspect of the present invention, the fourth group of lens elements includes at least one meniscus lens element having a concave surface facing the image side. The aplanatic lens element is a meniscus lens element having a negative refractive power and a concave lens surface facing the image side. The fourth group of lens elements includes a triplet sub-group of lens elements made up of a lens element having a positive refractive power, a lens element having a negative refractive power, and a lens element having a positive refractive power.

The projection exposure apparatus of the present invention thus provides lithography optical lens systems that have large numerical apertures and large exposure field sizes at the wafer plane with good aberration correction. The projection lens systems include an aplanatic lens element that does not contribute to the third order spherical and coma aberrations of the projection lens systems and helps balance the overall system aberrations and improves the overall system performance.

These and other advantages of the present invention will become more apparent upon a reading of the detailed description of the preferred embodiments that follow, when considered in conjunction with the drawings of which the following is a brief description. It should be clear that the drawings are merely illustrative of the currently preferred embodiment of the present invention, and that the invention is in no way limited to the illustrated embodiment. As will be realized, the invention is capable of other embodiments and its several details are capable of modifications in various obvious aspects, all without departing from the scope of the invention. The present invention is best defined by the claims appended to this specification.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

FIG. 1B shows the ray aberrations of the projection lens system shown in FIG. 1A for varying relative field heights all at a wavelength of 248.4 nanometers;

FIG. 2B shows the ray aberrations of the projection lens system shown in FIG. 2A for varying relative field heights all at a wavelength of 248.4 nanometers;

FIG. 4B shows the ray aberrations of the projection lens system shown in FIG. 4A for varying relative field heights all at a wavelength of 248.4 nanometers;

FIG. 5B shows the ray aberrations of the projection lens system shown in FIG. 5A for varying relative field heights all at a wavelength of 248.4 nanometers;

FIG. 6B shows the ray aberrations of the projection lens system shown in FIG. 6A for varying relative field heights all at a wavelength of 248.4 nanometers.

DETAILED DESCRIPTION

Figure 1A:
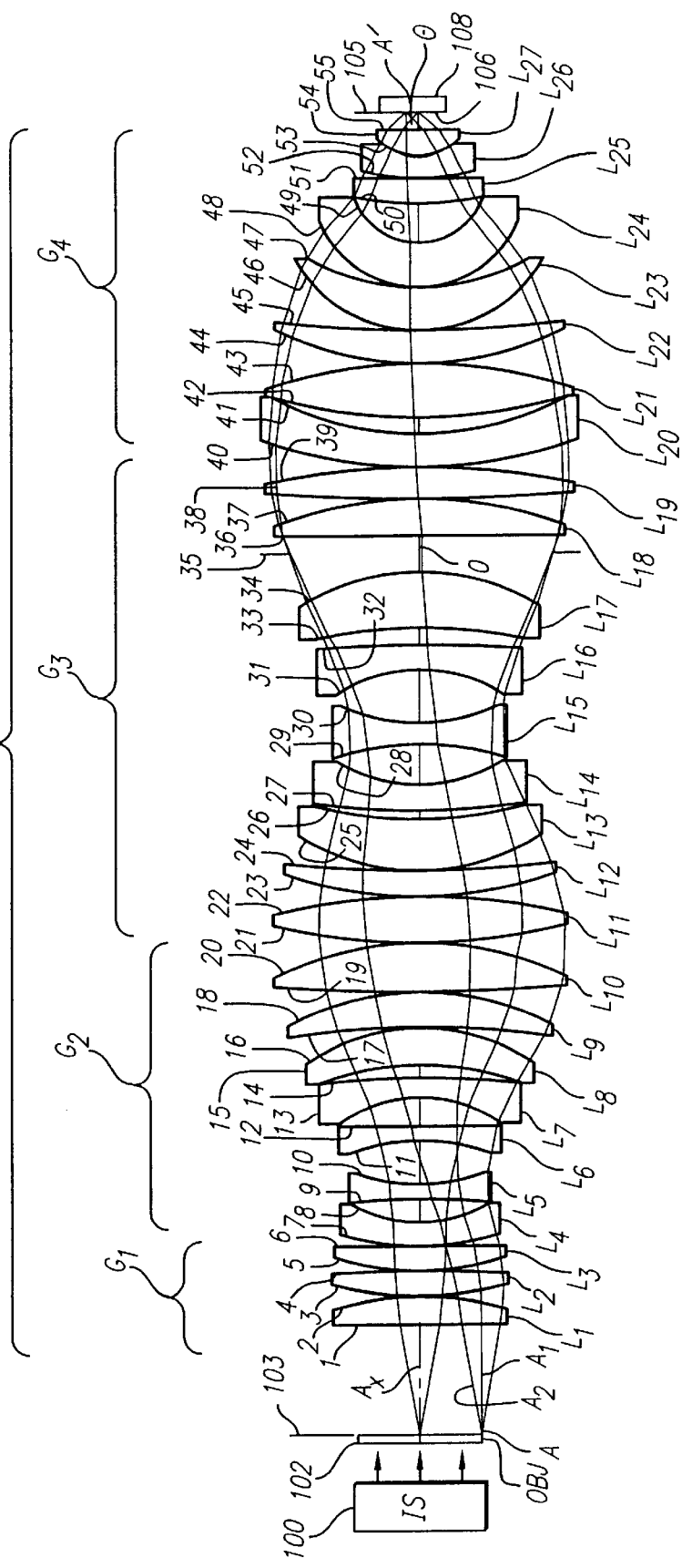
FIG. 1A is a schematic diagram of a projection lens system according to a first embodiment of the present invention.

The following detailed description is of the presently preferred embodiments of the present invention. It is to be understood that while the detailed description is given utilizing the drawings briefly described above, the invention is not limited to the illustrated embodiments. In the detailed description, like reference numbers refer to like elements.

Referring now to the figures, the several embodiments of the present invention will now be described. According to standard practice in the optical art, drawings of optical lens systems, such as those shown in the figures, have the object space, defined as all the space from the first element of surface of a system towards the object and beyond, on the left in the drawing. Similarly, the image space, defined as all the space from the last element or surface of a system towards the image and beyond, is on the right in the drawings.

Referring to FIG. 1A, there is shown a first embodiment of a reduction projection lens system in accordance with the present invention. In general, a projection lens system such as the projection lens system shown in FIG. 1A includes an illumination system (IS) 100, a reticle 102, located at the object or reticle plane 103, a projection lens system 104, and a wafer 106 located at the image (IMG) or wafer plane 105 and mounted on a wafer stage 108. As can be appreciated by a person of ordinary skill in the semiconductor manufacturing art, the above components are mounted in a stable secure structure that is not shown in this or any of the succeeding figures. The mounting structure is well known in the semiconductor manufacturing art and will not be discussed.

The illumination system 100 includes a source of illumination, such as a KrF excimer laser emitting illumination at a wavelength $\lambda$ of 248.4 nanometers or an ArF excimer laser emitting illumination at a wavelength $\lambda$ of 193 nanometers. The following detailed description will be limited to a discussion of an exposure apparatus using a KrF excimer laser emitting illumination at a wavelength $\lambda$ of 248.4 nanometers. Other excimer lasers are known in the art and could be used in place of the KrF excimer laser with minor modification to the projection lens system. Examples of illumination systems may be found in, for example, U.S. Pat. Nos.: 4,619,508; 4,851,978; 4,939,630; 5,237,367; 5,307,207; and 5,392,094. These patents are incorporated herein by reference in their entirety. An example of an exposure apparatus using an excimer laser source may be found in U.S. Pat. No. 4,952,945. This patent is incorporated herein by reference in its entirety. A projection exposure apparatus utilizing the output of an excimer laser to transfer the pattern of a reticle onto a semiconductor wafer is known from U.S. Pat. No. 4,458,994. This patent is also incorporated herein by reference in its entirety.

In FIG. 1A there is shown an off-axis point A on the reticle with traces $A_1$ and $A_2$ representing light rays originating from point A. The ray traces that originate at point A and pass through the pupil defined by the aperture stop 35 contribute to form a point image at the point A' on the wafer surface. The ray of light A1 passing through the center point C on the optical axis AX in the pupil is called a chief ray or principal ray. A chief ray or principal ray is parallel to the optical axis AX in the spaces on the object surface side and the image side in the case of a projection optical system in which both sides are telecentric. A ray from an axial object point $A_0$ on the reticle that just passes through the pupil or aperture stop is called a marginal ray. The sine of the angle $\theta$ between the marginal ray and the optical axis at the image plane at $A_0'$ corresponds to the numerical aperture NA on the wafer side of such a projection optical system and therefore the numerical aperture for the system is expressed as $NA = n \sin \theta$, where n is the refractive index of the image space medium, which is equal to unity for air. The numerical aperture of such a projection optical system is generally represented as the wafer side value.

Referring again to FIG. 1A, the projection lens system 104, viewed from the object side, in order of succession, includes a first group of lens elements $G_1$ with an overall positive refractive power, a second group of lens elements $G_2$ with an overall negative refractive power, a third group of lens elements $G_3$ with an overall positive refractive power, and a fourth group of lens elements $G_4$ with an overall positive refractive power. An aperture stop 35 is disposed in the third group of lens elements $G_3$. The fourth group of lens elements $G_4$ includes an aplanatic lens element $L_{24}$ and a lens triplet with lens elements $L_{25}$, $L_{26}$ and $L_{27}$. The fourth group of lens elements $G_4$ includes meniscus lens elements $L_{20}$, $L_{22}$, $L_{23}$, $L_{24}$, $L_{25}$, $L_{26}$, and $L_{27}$ all having the concave lens surface facing the image side. It is noted that the term "group of lens elements" includes a group having a single lens element. It is also noted that each lens element and each lens surface in FIG. 1A and subsequent figures are sequentially numbered from the object side to the image side of the lens system.

The aplanatic lens element $L_{24}$ satisfies the following condition:

$$0.1 < q_{ap} < 0.224,$$

where the shape factor $q_{ap} = (R_1 - R_2)/(R_1 + R_2)$ where $R_1$ is the radius of curvature of the lens surface facing the reticle side of the optical lens system and $R_2$ is the radius of curvature of the lens surface facing the image side of the optical lens system. The inequality $0.1 < q_{ap} < 0.224$ can be expressed in terms of the radii $R_1$ and $R_2$ of the aplanatic lens where $R_1$ and $R_2$ both have positive radii and $R_1 > R_2$. The inequality $0.1 < q_{ap} < 0.224$ is equivalent to $1.222 < R_1/R_2 < 1.57732$. Therefore, the inequality $1.222 < R_1/R_2$ corresponds to $0.1 < q_{ap}$ and $R_1/R_2 < 1.57732$ corresponds to $q_{ap} < 0.224$ and these further imply that if $q_{ap}$ is above the upper limit of the inequality $0.1 < q_{ap} < 0.224$, the negative refractive power aplanatic lens element will have a stronger radius and have larger contributions to higher order aberrations. If $q_{ap}$ is below the lower limit of the inequality $0.1 < q_{ap} < 0.224$, the dioptric power of the aplanatic lens will approach zero or that of a parallel plate, which would not be effective in balancing aberrations since the radius $R_2$ will approach the value of $R_1$ as $R_1/R_2$ approaches unity. The shape factor for the first embodiment shown in FIG. 1A is equal to 0.2021.

The optical lens system also satisfies the following condition:

$$2.0 < f_{ap}/F < -0.6251,$$

where $f_{ap}$ is the focal length of the aplanatic lens element and F is the focal length of the optical lens system. If $f_{ap}/F$ is above the upper limit of the inequality, the aplanatic lens element will have a stronger dioptric power since the focal length is shorter and it will have larger higher order aberrations. If $f_{ap}/F$ is below the lower limit, the aplanatic lens element will have a long focal length and will be less effective in balancing aberrations for the entire system. The value $f_{ap}/F$ for the first embodiment shown in FIG. 1A is $-0.6251$.

The optical lens system further satisfies the following condition:

$$2.6 < |f_{G3}/f_{G2}| < 4.64,$$

where $f_{G2}$ is the focal length of the second group of lens elements and $f_{G3}$ is the focal length of the third group of lens elements. If $|f_{G3}/f_{G2}|$ is below 2.6 the field dependent aberrations, coma, distortion, and astigmatism, are more difficult to correct. If $|f_{G3}/f_{G2}|$ is above 4.64, spherical aberration is more difficult to correct although the field dependent aberrations are easier to correct. In addition, if $|f_{G3}/f_{G2}|$ is outside the above limits, the diameter of the lens elements in the third group of lens elements is too large causing mechanical problems relating to the structure necessary to support the large diameter lens elements. The value $|f_{G3}/f_{G2}|$ for the first embodiment shown in FIG. 1A is 2.65.

FIG. 1B shows the ray aberrations of the projection lens system of the first embodiment for varying relative field heights at a wavelength of 248.4 nanometers.

Figure 1C:
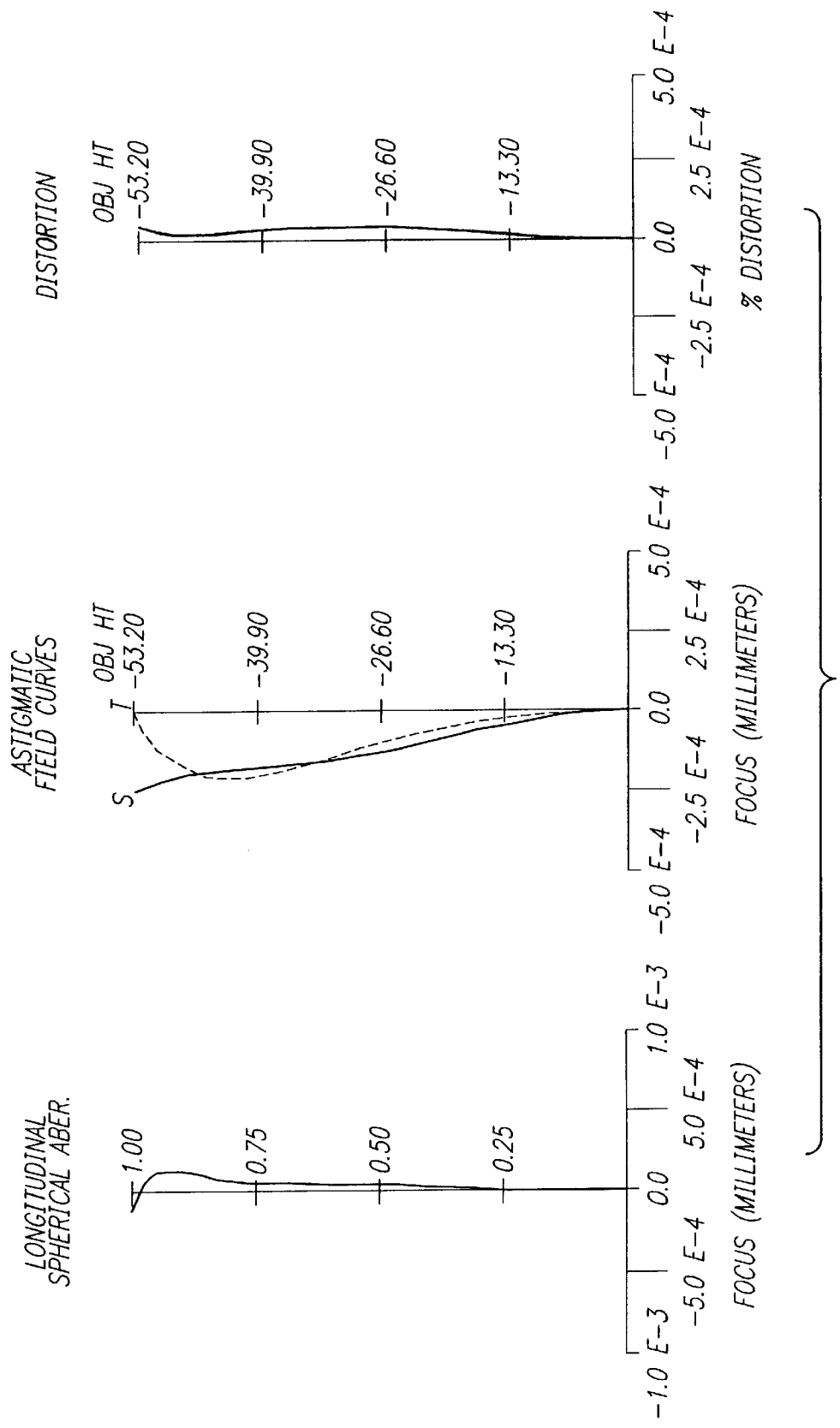
FIG. 1C shows the longitudinal spherical aberration, the astigmatic field curves, and the distortion of the projection lens system shown in FIG. 1A.

FIG. 1C shows the longitudinal spherical aberration, the astigmatic field curves, and the distortion of the projection lens system of the first embodiment.

As will be appreciated by a person of ordinary skill in the optical art, the ray aberration diagrams shown in FIG. 1B indicate how the image quality of a lens system can affect the intended purpose of the lens system. A determination of the aberration content of the lens system can be obtained by an examination of the ray intercept plots for a lens system shown in FIG. 1B and an examination of the longitudinal plots of spherical aberration, astigmatism and distortion shown in FIG. 1C. In the ray intercept plots the ray displacements are plotted vertically as a function of the position of the ray in the aperture. The vertical scale is given at the lower end of the vertical bar for the axial plot; the number given is the half-length (i.e., from the origin to the end) of the vertical line in the plot. The horizontal scale is proportional to the tangent of the ray slope angle. In accordance with the usual convention, the upper ray of the ray fan is plotted to the right.

Table 1 below shows the values of specifications for the first embodiment described above. The numbers in the leftmost column indicate the order of optical surfaces from the object (reticle) side to the image (wafer) side, r is the curvature radius in millimeters of the lens surface (a positive radius indicates the center of curvature is towards the right or image side and a negative radius indicates the center of curvature is towards the left or reticle side), and d is the axial distance in millimeters to the next lens surface.

The optical material used in all lens elements in Table 1 is fused silica ($SiO_2$) having a refractive index of 1.508379 at a wavelength of 248.2 nanometers. As can be appreciated by one of ordinary skill in the art, the refractive index can vary slightly depending upon the grade of silica from which the lens elements are manufactured and also depends upon the capability of the manufacturer of the lens material.

TABLE 1

Object plane to first optical surface = 92.999777 mm
Last optical surface to image plane = 16.220579 mm
$f_{G1}$ = 168.6, $f_{G2}$ = −461.23 mm, $f_{G3}$ = 1224.40 mm, $f_{G4}$ = 168.65 mm
$f_{ap}$ = −622.42 mm, $q_{ap}$ = 0.2021, F = 995.76 mm, L = 1160 mm
Refractive index of all glass elements @ 248.4 nanometers = 1.508379.
NA = 0.7, 4X Reduction, Exposure field size = 26.5 mm diameter

| Surface number | Radius of curvature (mm) | axial distance (mm) | Optical material |
|---|---|---|---|
| OBJ | INFINITY | 92.999777 | |
| 1 | INFINITY | 24.729516 | silica |
| 2 | −289.76980 | 0.611721 | air |
| 3 | 340.77770 | 21.295436 | silica |
| 4 | −1113.00903 | 0.697787 | air |
| 5 | 239.14655 | 21.963611 | silica |
| 6 | −1914.26381 | 0.500000 | air |
| 7 | 284.65574 | 18.000000 | silica |
| 8 | 108.87196 | 21.313869 | air |
| 9 | −507.02565 | 12.500000 | silica |
| 10 | 154.48689 | 37.462553 | air |
| 11 | −193.43441 | 12.500000 | silica |
| 12 | 1336.94963 | 24.818545 | air |
| 13 | −124.90781 | 18.000000 | silica |
| 14 | −623.38366 | 10.265845 | air |
| 15 | −238.98236 | 32.271981 | silica |
| 16 | −163.47761 | 0.500000 | air |
| 17 | −889.19487 | 32.605338 | silica |
| 18 | −238.08656 | 1.043433 | air |
| 19 | 1737.55771 | 43.059040 | silica |
| 20 | −282.81729 | 0.500000 | air |
| 21 | 461.58616 | 41.018603 | silica |
| 22 | −568.75787 | 0.500000 | air |
| 23 | 319.39892 | 23.848667 | silica |
| 24 | 817.64562 | 0.500000 | air |
| 25 | 194.52398 | 45.508712 | silica |
| 26 | 326.82142 | 7.992541 | air |
| 27 | 767.80357 | 22.000000 | silica |
| 28 | 132.63856 | 35.629375 | air |
| 29 | −238.48643 | 18.000000 | silica |
| 30 | 170.83985 | 47.194956 | air |
| 31 | −135.56460 | 22.000000 | silica |
| 32 | −1715.56407 | 15.626950 | air |
| 33 | −482.69013 | 49.373979 | silica |
| 34 | −193.34448 | 18.789661 | air |
| 35 (STOP) | INFINITY | 15.000000 | air |

TABLE 1-continued

Object plane to first optical surface = 92.999777 mm
Last optical surface to image plane = 16.220579 mm
$f_{G1}$ = 168.6, $f_{G2}$ = −461.23 mm, $f_{G3}$ = 1224.40 mm, $f_{G4}$ = 168.65 mm
$f_{ap}$ = −622.42 mm, $q_{ap}$ = 0.2021, F = 995.76 mm, L = 1160 mm
Refractive index of all glass elements @ 248.4 nanometers = 1.508379.
NA = 0.7, 4X Reduction, Exposure field size = 26.5 mm diameter

| Surface number | Radius of curvature (mm) | axial distance (mm) | Optical material |
|---|---|---|---|
| 36 | INFINITY | 31.657796 | silica |
| 37 | −350.62300 | 0.500000 | air |
| 38 | 1379.62016 | 27.105727 | silica |
| 39 | −693.79419 | 0.500000 | air |
| 40 | 368.84674 | 30.000000 | silica |
| 41 | 255.93485 | 15.156590 | air |
| 42 | 446.84164 | 45.821503 | silica |
| 43 | −441.30108 | 0.500000 | air |
| 44 | 260.34308 | 29.188126 | silica |
| 45 | 724.80453 | 0.500000 | air |
| 46 | 125.66145 | 38.154054 | silica |
| 47 | 201.01694 | 0.500000 | air |
| 48 | 95.89268 | 38.414327 | silica |
| 49 | 63.65515 | 32.687760 | air |
| 50 | 388.03305 | 20.139182 | silica |
| 51 | 2328.36225 | 0.500000 | air |
| 52 | 179.77412 | 18.000000 | silica |
| 53 | 56.38618 | 0.500000 | air |
| 54 | 48.22876 | 23.332388 | silica |
| 55 | 563.63845 | 16.220579 | air |
| IMG | INFINITY | 0.000000 | |

Where $f_{G1}$ is the focal length of the first group of lens element $G_1$, $f_{G2}$ is the focal length of the second group of lens elements $G_2$, $f_{G3}$ is the focal length of the third group of lens elements $G_3$, and $f_{G4}$ is the focal length of the fourth group of lens elements $G_4$. F is the overall focal length of the projection lens system and L is the overall length of the projection lens system (from the reticle plane to the wafer plane). The value $f_{ap}$ is the focal length of the aplanatic lens element. The value $q_{ap}$ is the shape factor of the aplanatic lens element and is equal to $(R_1-R_2)/(R_1+R_2)$ where $R_1$ is the radius of curvature of the lens surface of the aplanatic lens element facing the reticle side of the optical lens system and $R_2$ is the radius of curvature of the lens surface of the aplanatic lens element facing the image side of the optical lens system.

Figure 2A:
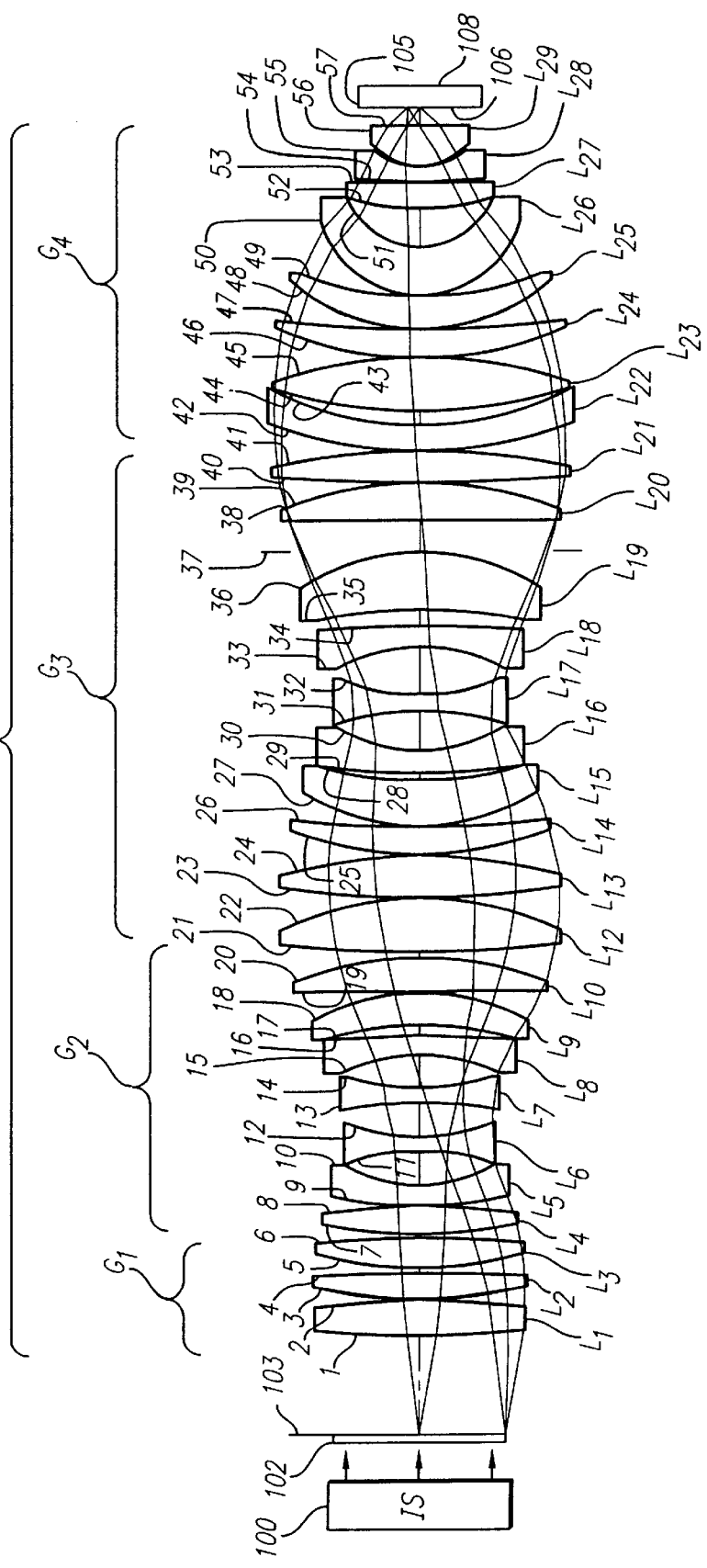
FIG. 2A is a schematic diagram of a projection lens system according to a second embodiment of the present invention.

Referring to FIG. 2A, there is shown a second embodiment of a projection lens system in accordance with the present invention. The projection lens system 200 viewed from the object side, in order of succession, includes a first group of lens elements $G_1$ with an overall positive refractive power, a second group of lens elements $G_2$ with an overall negative refractive power, a third group of lens elements $G_3$ having an overall positive refractive power, and a fourth group of lens elements $G_4$ having an overall positive refractive power. An aperture stop 37 is disposed in the third group of lens elements $G_3$. The fourth group of lens elements $G_4$ includes an aplanatic lens element $L_{26}$ and a lens triplet with lens elements $L_{27}$, $L_{28}$, and $L_{29}$. The fourth group of lens elements $G_4$ includes meniscus lens elements $L_{22}$, $L_{24}$, $L_{25}$, $L_{26}$, $L_{28}$, and $L_{29}$ all having the concave lens surfacing facing the image side.

The aplanatic lens element $L_{24}$ satisfies the following condition:

$$0.1 < q_{ap} < 0.224,$$

where the shape factor $q_{ap} = (R_1-R_2)/(R_1+R_2)$ where $R_1$ is the radius of curvature of the lens surface facing the reticle side of the optical lens system and $R_2$ is the radius of curvature of the lens surface facing the image side of the optical lens system. The inequality $0.1<q_{ap}<0.224$ can be expressed in terms of the radii $R_1$ and $R_2$ of the aplanatic lens where $R_1$ and $R_2$ both have positive radii and $R_1>R_2$. The inequality $0.1<q_{ap}<0.224$ is equivalent to $1.222<R_1/R_2<1.57732$. Therefore, the inequality $1.222<R_1/R_2$ corresponds to $0.1<q_{ap}$ and $R_1/R_2<1.57732$ corresponds to $q_{ap}<0.224$ and these further imply that if $q_{ap}$ is above the upper limit of the inequality $0.1<q_{ap}<0.224$, the negative refractive power aplanatic lens element will have a stronger radius and have larger contributions to higher order aberrations. If $q_{ap}$ is below the lower limit of the inequality $0.1<q_{ap}<0.224$, the dioptric power of the aplanatic lens will approach zero or that of a parallel plate, which would not be effective in balancing aberrations since the radius $R_2$ will approach the value of $R_1$ as $R_1/R_2$ approaches unity. The shape factor for the second embodiment shown in FIG. 2A is equal to 0.1568.

The optical lens system also satisfies the following condition:

$$-2.0<f_{ap}/F<-0.6251,$$

where $f_{ap}$ is the focal length of the aplanatic lens element and F is the focal length of the optical lens system. If $f_{ap}/F$ is above the upper limit of the inequality, the aplanatic lens element will have a stronger dioptric power since the focal length is shorter and it will have larger higher order aberrations. If $f_{ap}/F$ is below the lower limit, the aplanatic lens element will have a long focal length and will be less effective in balancing aberrations for the entire system. The value $f_{ap}/F$ for the second embodiment shown in FIG. 2A is $-1.90777$.

The optical lens system further satisfies the following condition:

$$2.6<|f_{G3}/f_{G2}|<4.64,$$

where $f_{G2}$ is the focal length of the second group of lens elements and $f_{G3}$ is the focal length of the third group of lens elements. If $|f_{G3}/f_{G2}|$ is below 2.6 the field dependent aberrations, coma, distortion, and astigmatism, are more difficult to correct. If $|f_{G3}/f_{G2}|$ is above 4.64, spherical aberration is more difficult to correct although the field dependent aberrations are easier to correct. In addition, if $|f_{G3}/f_{G2}|$ is outside the above limits, the diameter of the lens elements in the third group of lens elements is too large causing mechanical problems relating to the structure necessary to support the large diameter lens elements. The value $|f_{G3}/f_{G2}|$ for the second embodiment shown in FIG. 2A is 4.20.

FIG. 2B shows the ray aberrations of the projection lens system of the second embodiment for varying relative field heights at a wavelength of 248.4 nanometers.

Figure 2C:
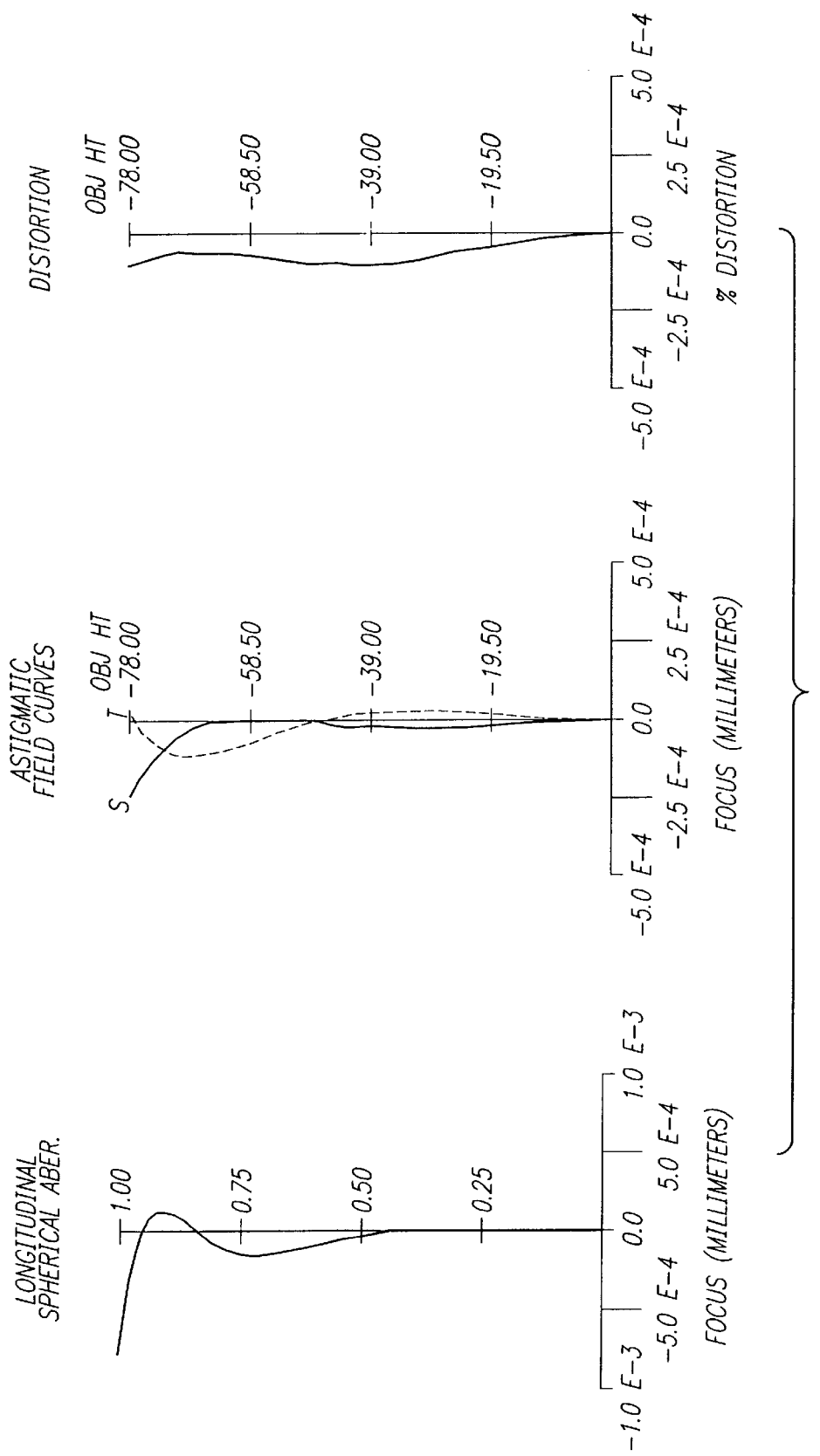
FIG. 2C shows the longitudinal spherical aberration, the astigmatic field curves, and the distortion of the projection lens system shown in FIG. 2A.

FIG. 2C shows the longitudinal spherical aberration, the astigmatic field curves, and the distortion of the projection lens system of the second embodiment.

The significance of the ray aberration diagrams, astigmatic field curves and distortion shown in FIGS. 2B & 2C is described above in relation to the discussion of FIGS 1B & 1C.

Table 2 below shows the values of specifications for the second embodiment described above. The parameters are the same as described above for Table 1.

TABLE 2

Object plane to first optical surface = 93.027179 mm
Last optical surface to image plane = 16.554548 mm
$f_{G1}$ = 180.71 mm, $f_{G2}$ = −359.83 mm, $f_{G3}$ = 1503.2 mm,
$f_{G4}$ = 171.83 mm
$f_{ap}$ = −1195.03 mm, F = 626.40 mm, L = 1238.53 mm.
Refractive index of all glass elements = 1.508379 at a wavelength of 248.4 nanometers
NA = 0.70, 5X Reduction, Exposure field size = 31.20 mm diameter

| Surface number | Radius of curvature (mm) | axial distance (mm) | Optical material |
|---|---|---|---|
| OBJ | INFINITY | 93.027179 | |
| 1 | 923.68847 | 32.884158 | silica |
| 2 | −871.82519 | 1.776398 | air |
| 3 | 632.88634 | 25.434973 | silica |
| 4 | −1288.29011 | 4.447108 | air |
| 5 | 410.82864 | 26.476197 | silica |
| 6 | −929.34770 | 2.996166 | air |
| 7 | 410.89235 | 25.116886 | silica |
| 8 | −782.81214 | 1.267534 | air |
| 9 | 406.23497 | 18.000000 | silica |
| 10 | 127.85902 | 29.383510 | air |
| 11 | −243.42152 | 15.000000 | silica |
| 12 | 169.69809 | 29.715261 | air |
| 13 | −508.90206 | 15.000000 | silica |
| 14 | 235.75989 | 31.297688 | air |
| 15 | −158.85054 | 18.000000 | silica |
| 16 | −1060.47496 | 11.270207 | air |
| 17 | −282.03861 | 30.972735 | silica |
| 18 | −196.54331 | 2.119368 | air |
| 19 | −6442.28405 | 30.787957 | silica |
| 20 | −316.19995 | 5.613636 | air |
| 21 | 1012.57685 | 48.879033 | silica |
| 22 | −303.40473 | 1.621908 | air |
| 23 | 745.69984 | 37.631034 | silica |
| 24 | −509.10262 | 1.000000 | air |
| 25 | 313.72364 | 25.012254 | silica |
| 26 | 848.17044 | 1.014410 | air |
| 27 | 193.27335 | 41.293845 | silica |
| 28 | 344.43306 | 6.466632 | air |
| 29 | 555.26885 | 20.000000 | silica |
| 30 | 130.47146 | 41.962588 | air |
| 31 | −212.30607 | 15.000000 | silica |
| 32 | 207.93500 | 46.594157 | air |
| 33 | −141.71386 | 20.000000 | silica |
| 34 | −1674.51801 | 14.041062 | air |
| 35 | −455.23762 | 50.202048 | silica |
| 36 | −203.65392 | 20.363470 | air |
| 37 (STOP) | INFINITY | 10.000108 | air |
| 38 | INFINITY | 33.136060 | silica |
| 39 | −349.42949 | 1.000000 | air |
| 40 | 2227.68336 | 27.417350 | silica |
| 41 | −603.16014 | 1.000000 | air |
| 42 | 395.80099 | 25.195047 | silica |
| 43 | 256.68864 | 14.444922 | air |
| 44 | 400.24129 | 48.850312 | silica |
| 45 | −482.73107 | 1.000123 | air |
| 46 | 285.09018 | 30.083426 | silica |
| 47 | 888.29325 | 1.000464 | air |
| 48 | 171.37066 | 32.094321 | silica |
| 49 | 296.58780 | 1.011712 | air |
| 50 | 96.81538 | 44.536570 | silica |
| 51 | 70.56045 | 34.776830 | air |
| 52 | 233.65924 | 25.137915 | silica |
| 53 | −1744.71713 | 1.021066 | air |
| 54 | 786.92219 | 12.500000 | silica |
| 55 | 71.81958 | 1.023130 | air |
| 56 | 59.44372 | 35.076328 | silica |
| 57 | 1833.95718 | 16.554548 | air |
| IMG | INFINITY | 0.000000 | |

The parameter definitions for Table 2 are the same as described above for Table 1.

Figure 3A:
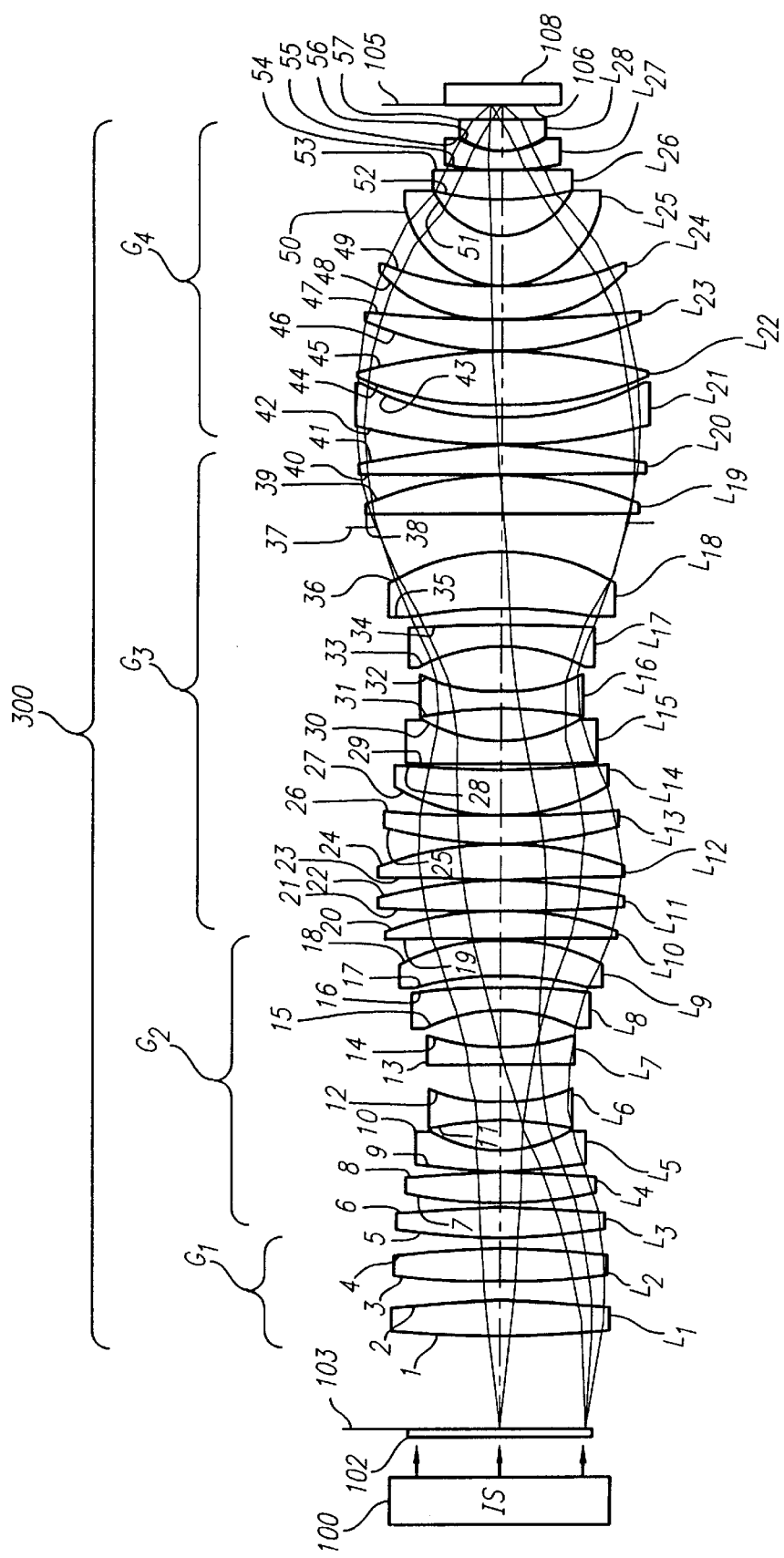
FIG. 3A is a schematic diagram of a projection lens system according to a third embodiment of the present invention.

Referring to FIG. 3A, a third embodiment of a projection lens system in accordance with the present invention is shown. The projection lens system 300, viewed from the object side, in order of succession, includes a first group of lens elements $G_1$ with an overall positive refractive power, a second group of lens elements $G_2$ with an overall negative refractive power, a third group of lens elements $G_3$ with an overall positive refractive power, and a fourth group of lens elements $G_4$ with an overall positive refractive power. An aperture stop 37 is disposed in the third group of lens elements $G_3$. The fourth group of lens elements $G_4$ includes an aplanatic lens element $L_{25}$ and a lens triplet with lens elements $L_{27}$, $L_{28}$, and $L_{29}$. The fourth group of lens elements $G_4$ includes meniscus lens elements $L_{21}$, $L_{23}$, $L_{24}$, $L_{25}$, $L_{26}$, $L_{27}$, and $L_{28}$ all having the concave surface facing the image side.

The aplanatic lens element $L_{24}$ satisfies the following condition:

$$0.1 < q_{ap} < 0.224,$$

where the shape factor $q_{ap} = (R_1 - R_2)/(R_1 + R_2)$ where $R_1$ is the radius of curvature of the lens surface facing the reticle side of the optical lens system and $R_2$ is the radius of curvature of the lens surface facing the image side of the optical lens system. The inequality $0.1 < q_{ap} < 0.224$ can be expressed in terms of the radii $R_1$ and $R_2$ of the aplanatic lens where $R_1$ and $R_2$ both have positive radii and $R_1 > R_2$. The inequality $0.1 < q_{ap} < 0.224$ is equivalent to $1.222 < R_1/R_2 < 1.57732$. Therefore, the inequality $1.222 < R_1/R_2$ corresponds to $0.1 < q_{ap}$ and $R_1/R_2 < 1.57732$ corresponds to $q_{ap} < 0.224$ and these further imply that if $q_{ap}$ is above the upper limit of the inequality $0.1 < q_{ap} < 0.224$, the negative refractive power aplanatic lens element will have a stronger radius and have larger contributions to higher order aberrations. If $q_{ap}$ is below the lower limit of the inequality $0.1 < q_{ap} < 0.224$, the dioptric power of the aplanatic lens will approach zero or that of a parallel plate, which would not be effective in balancing aberrations since the radius $R_2$ will approach the value of $R_1$ as $R_1/R_2$ approaches unity. The shape factor for the third embodiment shown in FIG. 3A is equal to 0.1671.

The optical lens system also satisfies the following condition:

$$-2.0 < f_{ap}/F < -0.6251,$$

where $f_{ap}$ is the focal length of the aplanatic lens element and F is the focal length of the optical lens system. If $f_{ap}/F$ is above the upper limit of the inequality, the aplanatic lens element will have a stronger dioptric power since the focal length is shorter and it will have larger higher order aberrations. If $f_{ap}/F$ is below the lower limit, the aplanatic lens element will have a long focal length and will be less effective in balancing aberrations for the entire system. The value $f_{ap}/F$ for the third embodiment shown in FIG. 3A is $-1.92834$.

The optical lens system further satisfies the following condition:

$$2.6 < |f_{G3}/f_{G2}| < 4.64,$$

where $f_{G2}$ is the focal length of the second group of lens elements and $f_{G3}$ is the focal length of the third group of lens elements. If $|f_{G3}/f_{G2}|$ is below 2.6 the field dependent aberrations, coma, distortion, and astigmatism, are more difficult to correct. If $|f_{G3}/f_{G2}|$ is above 4.64, spherical aberration is more difficult to correct although the field dependent aberrations are easier to correct. In addition, if $|f_{G3}/f_{G2}|$ is outside the above limits, the diameter of the lens elements in the third group of lens elements is too large causing mechanical problems relating to the structure necessary to support the large diameter lens elements. The value $|f_{G3}/f_{G2}|$ for the third embodiment shown in FIG. 3A is 4.36.

Figure 3B:
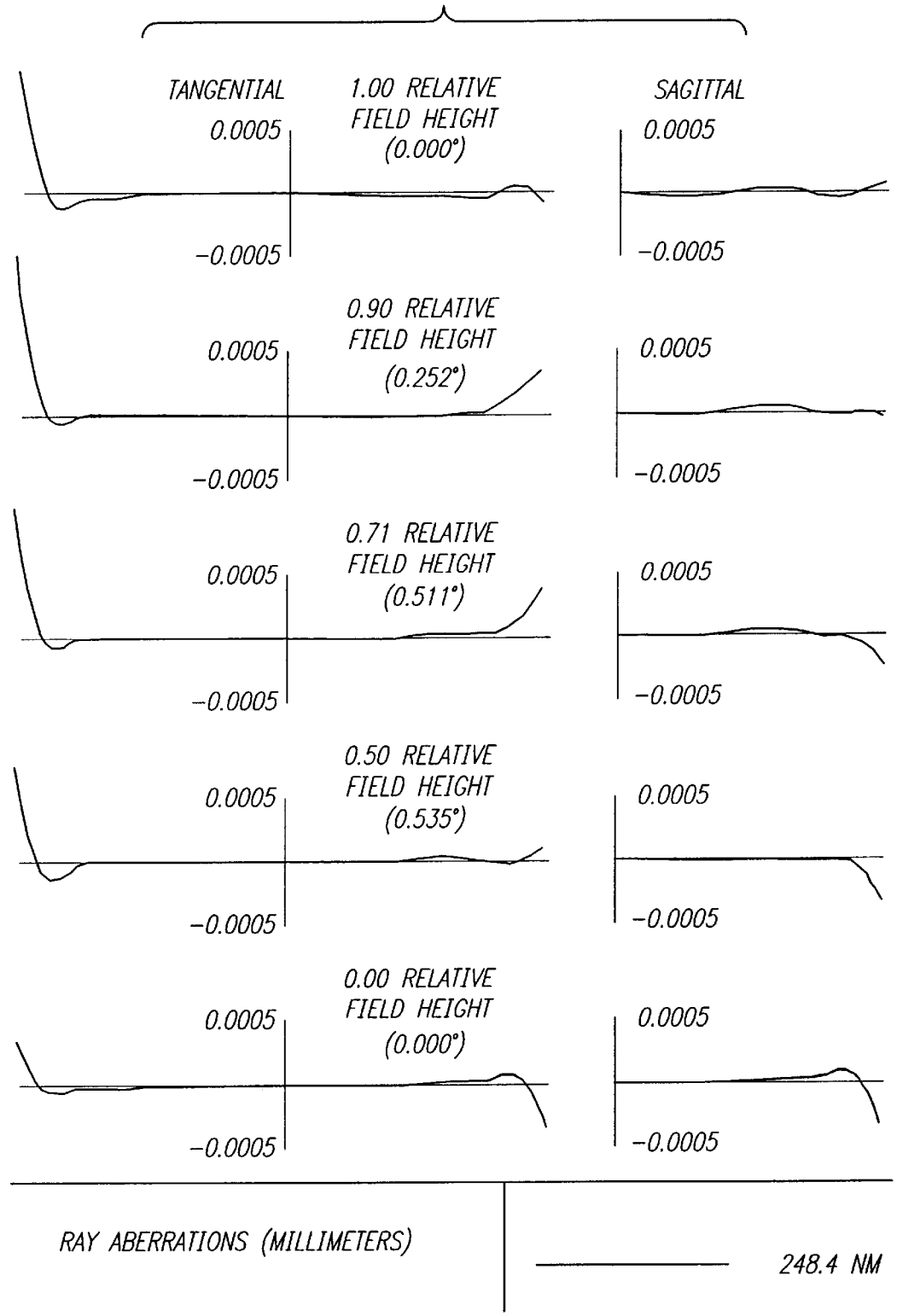
FIG. 3B shows the ray aberrations of the projection lens system shown in FIG. 3A for varying relative field heights all at a wavelength of 248.4 nanometers.

FIG. 3B shows the ray aberrations of the projection lens system of the third embodiment for varying relative field heights at a wavelength of 248.4 nanometers.

Figure 3C:
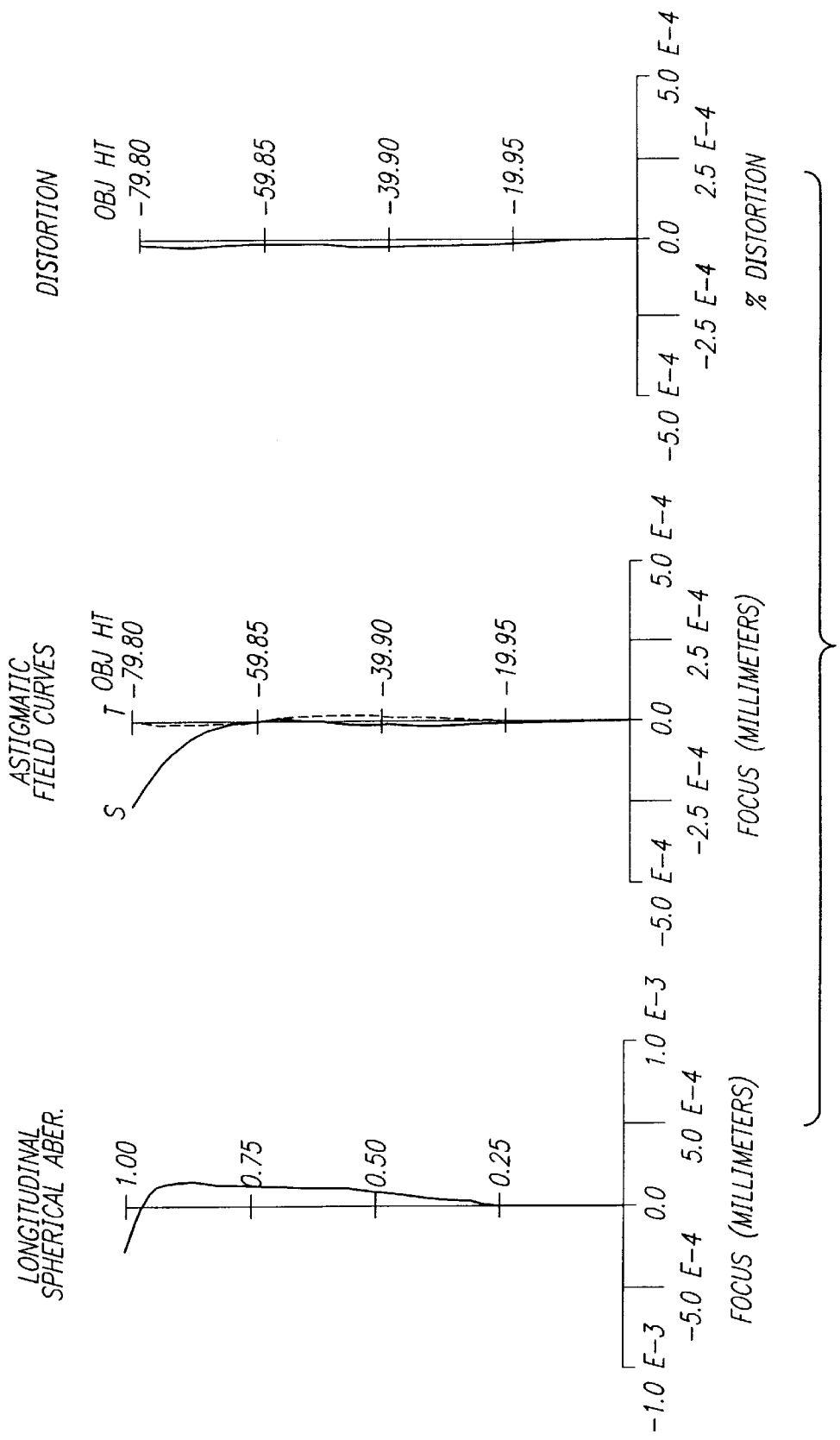
FIG. 3C shows the longitudinal spherical aberration, the astigmatic field curves, and the distortion of the projection lens system shown in FIG. 3A.

FIG. 3C shows the longitudinal spherical aberration, the astigmatic field curves, and the distortion of the projection lens system of the third embodiment.

The significance of the ray aberration diagrams, astigmatic field curves and distortion shown in FIGS. 3B & 3C is described above in relation to the discussion of FIGS 1B & 1C.

Table 3 below shows the values of specifications for the third embodiment described above. The parameters are the same as described above for Table 1.

TABLE 3

Object plane to first optical surface = 83.000535 mm
Last optical surface to image plane = 12.535329 mm
$f_{G1}$ = 184.03 mm, $f_{G2}$ = −197.47 mm, $f_{G3}$ = 860.753 mm,
$f_{G4}$ = 159.72 mm
$f_{ap}$ = −1023.70 mm, $q_{ap}$ = 0.1671, F = 530.87 mm, L = 1175 mm
Refractive index of all glass elements = 1.508379 at a wavelength of 248.4 nanometers
NA = 0.70, 6X Reduction, Exposure field size = 26.6 mm diameter

| Surface number | Radius of curvature (mm) | Axial distance (mm) | Optical material |
|---|---|---|---|
| OBJ | INFINITY | 83.000535 | |
| 1 | 686.53294 | 30.020013 | silica |
| 2 | −789.25424 | 16.381386 | air |
| 3 | 825.77271 | 28.771490 | silica |
| 4 | −957.97485 | 9.847480 | air |
| 5 | 469.23834 | 27.958027 | silica |
| 6 | −845.15494 | 4.630522 | air |
| 7 | 386.57088 | 27.224381 | silica |
| 8 | −886.11409 | 1.545138 | air |
| 9 | 431.03419 | 18.000000 | silica |
| 10 | 122.78504 | 26.080468 | air |
| 11 | −254.74058 | 15.000000 | silica |
| 12 | 155.17391 | 33.737108 | air |
| 13 | INFINITY | 15.000000 | silica |
| 14 | 183.75734 | 32.313791 | air |
| 15 | −142.80488 | 18.000000 | silica |
| 16 | −1397.70303 | 11.225352 | air |
| 17 | −327.93839 | 30.327165 | silica |
| 18 | −193.63690 | 1.282399 | air |
| 19 | INFINITY | 26.198878 | silica |
| 20 | −306.33348 | 1.309771 | air |
| 21 | 1885.14284 | 26.436910 | silica |
| 22 | −406.54026 | 1.423718 | air |
| 23 | 1331.44028 | 32.038120 | silica |
| 24 | −322.51451 | 1.000000 | air |
| 25 | 284.43218 | 25.000000 | silica |
| 26 | 957.16807 | 1.007163 | air |
| 27 | 183.81954 | 39.315171 | silica |
| 28 | 497.43587 | 5.551074 | air |
| 29 | 1281.23768 | 20.000000 | silica |
| 30 | 123.65372 | 29.067130 | air |
| 31 | −352.61413 | 15.000000 | silica |
| 32 | 164.37280 | 41.880423 | air |
| 33 | −116.25358 | 20.000000 | silica |
| 34 | −1829.99324 | 15.473388 | air |
| 35 | −493.43834 | 51.206860 | silica |
| 36 | −186.63942 | 22.310679 | air |
| 37 (STOP) | INFINITY | 10.565356 | air |
| 38 | INFINITY | 31.752369 | silica |
| 39 | −327.73859 | 1.000000 | air |
| 40 | 2176.29725 | 26.543695 | silica |
| 41 | −524.29479 | 1.000000 | air |
| 42 | 435.91369 | 25.000000 | silica |
| 43 | 238.64932 | 11.986236 | air |
| 44 | 311.03251 | 48.311508 | silica |
| 45 | −480.92179 | 1.000000 | air |
| 46 | 255.95846 | 27.554266 | silica |
| 47 | 698.32815 | 1.000000 | air |
| 48 | 156.15970 | 29.378737 | silica |
| 49 | 264.11310 | 1.000000 | air |

TABLE 3-continued

Object plane to first optical surface = 83.000535 mm
Last optical surface to image plane = 12.535329 mm
$f_{G1}$ = 184.03 mm, $f_{G2}$ = −197.47 mm, $f_{G3}$ = 860.753 mm,
$f_{G4}$ = 159.72 mm
$f_{ap}$ = −1023.70 mm, $q_{ap}$ = 0.1671, F = 530.87 mm, L = 1175 mm
Refractive index of all glass elements = 1.508379 at a wavelength of 248.4 nanometers
NA = 0.70, 6X Reduction, Exposure field size = 26.6 mm diameter

| Surface number | Radius of curvature (mm) | Axial distance (mm) | Optical material |
|---|---|---|---|
| 50 | 87.94823 | 43.250545 | silica |
| 51 | 62.76432 | 30.385263 | air |
| 52 | 189.89004 | 25.024362 | silica |
| 53 | 1764.06457 | 1.018225 | air |
| 54 | 311.01556 | 12.500000 | silica |
| 55 | 55.17186 | 1.000000 | air |
| 56 | 48.57761 | 28.624116 | silica |
| 57 | 1036.92348 | 12.535329 | air |
| IMG | INFINITY | 0.000000 | |

The parameter definitions for Table 2 are the same as described above for Table 1.

Figure 4A:
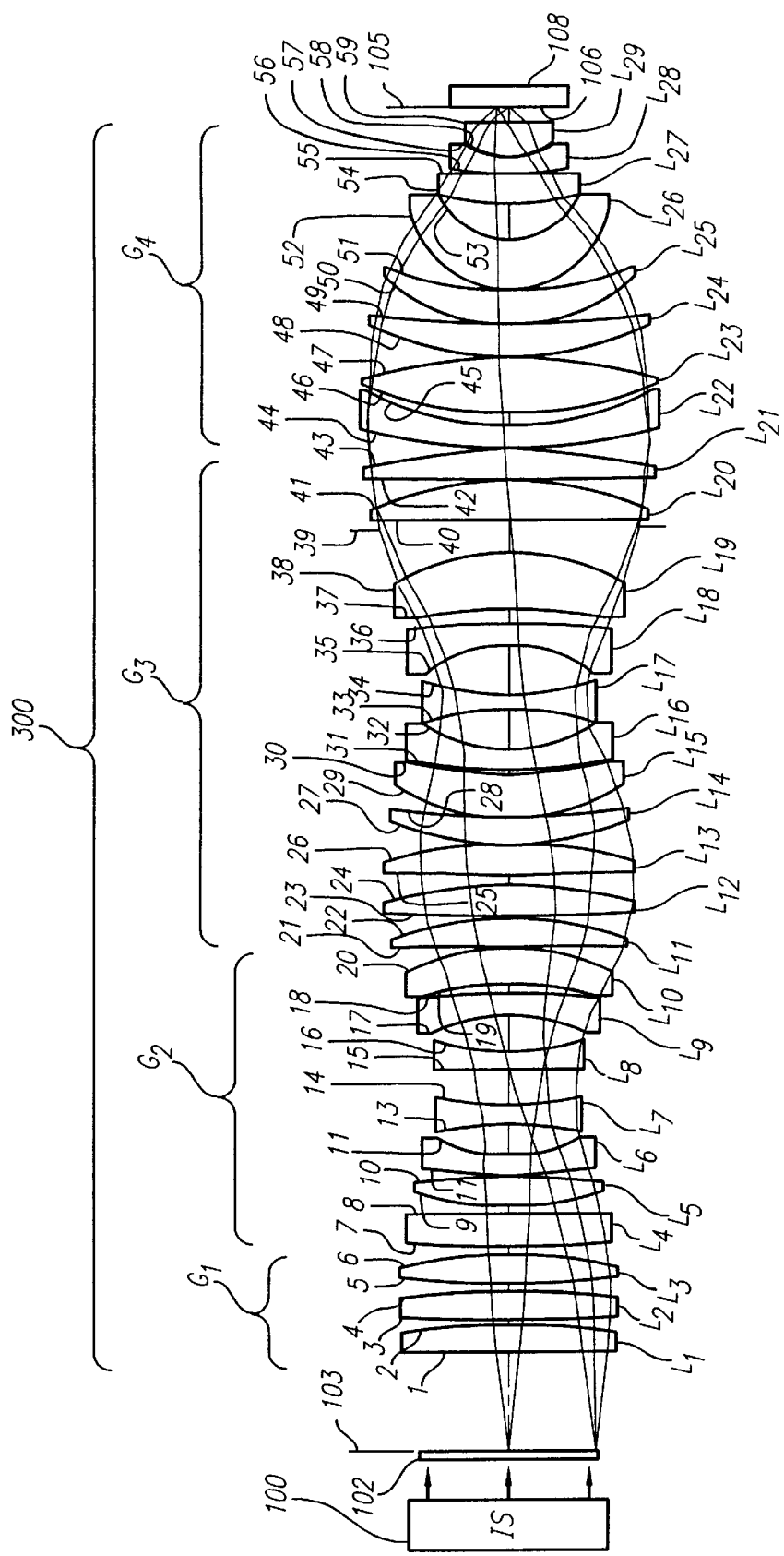
FIG. 4A is a schematic diagram of a projection lens system according to a fourth embodiment of the present invention.

Referring to FIG. 4A, a fourth embodiment of a projection lens system in accordance with the present invention is shown. The projection lens system 400 viewed from the object, in order of succession, includes a first group of lens elements $G_1$ with an overall positive refractive power, a second group of lens elements $G_2$ with an overall negative refractive power, a third group of lens elements $G_3$ with an overall positive refractive power, and a fourth group of lens elements $G_4$ with an overall positive refractive power. An aperture stop 39 is disposed in the third group of lens elements $G_3$. The fourth group of lens elements $G_4$ includes an aplanatic lens element $L_{26}$ and a lens triplet with lens elements $L_{27}$, $L_{28}$, and $L_{29}$. The fourth group of lens elements $G_4$ includes meniscus lens elements $L_{22}$, $L_{24}$, $L_{25}$, $L_{26}$, $L_{28}$, and $L_{29}$ all having the concave surface facing the image side.

The aplanatic lens element $L_{24}$ satisfies the following condition:

$$0.1 < q_{ap} < 0.224,$$

where the shape factor $q_{ap} = (R_1 - R_2)/(R_1 + R_2)$ where $R_1$ is the radius of curvature of the lens surface facing the reticle side of the optical lens system and $R_2$ is the radius of curvature of the lens surface facing the image side of the optical lens system. The inequality $0.1 < q_{ap} < 0.224$ can be expressed in terms of the radii $R_1$ and $R_2$ of the aplanatic lens where $R_1$ and $R_2$ both have positive radii and $R_1 > R_2$. The inequality $0.1 < q_{ap} < 0.224$ is equivalent to $1.222 < R_1/R_2 < 1.57732$. Therefore, the inequality $1.222 < R_1/R_2$ corresponds to $0.1 < q_{ap}$ and $R_1/R_2 < 1.57732$ corresponds to $q_{ap} < 0.224$ and these further imply that if $q_{ap}$ is above the upper limit of the inequality $0.1 < q_{ap} < 0.224$, the negative refractive power aplanatic lens element will have a stronger radius and have larger contributions to higher order aberrations. If $q_{ap}$ is below the lower limit of the inequality $0.1 < q_{ap} < 0.224$, the dioptric power of the aplanatic lens will approach zero or that of a parallel plate, which would not be effective in balancing aberrations since the radius $R_2$ will approach the value of $R_1$ as $R_1/R_2$ approaches unity. The shape factor for the fourth embodiment shown in FIG. 4A is equal to 0.1673.

The optical lens system also satisfies the following condition:

$$-2.0 < f_{ap}/F < -0.6251,$$

where $f_{ap}$ is the focal length of the aplanatic lens element and F is the focal length of the optical lens system. If $f_{ap}/F$ is above the upper limit of the inequality, the aplanatic lens element will have a stronger dioptric power since the focal length is shorter and it will have larger higher order aberrations. If $f_{ap}/F$ is below the lower limit, the aplanatic lens element will have a long focal length and will be less effective in balancing aberrations for the entire system. The value $f_{ap}/F$ for the fourth embodiment shown in FIG. 4A is −1.9247.

The optical lens system further satisfies the following condition:

$$2.6 < |f_{G3}/f_{G2}| < 4.64,$$

where $f_{G2}$ is the focal length of the second group of lens elements and $f_{G3}$ is the focal length of the third group of lens elements. If $|f_{G3}/f_{G2}|$ is below 2.6 the field dependent aberrations, coma, distortion, and astigmatism, are more difficult to correct. If $|f_{G3}/f_{G2}|$ is above 4.64, spherical aberration is more difficult to correct although the field dependent aberrations are easier to correct. In addition, if $|f_{G3}/f_{G2}|$ is outside the above limits, the diameter of the lens elements in the third group of lens elements is too large causing mechanical problems relating to the structure necessary to support the large diameter lens elements. The value $|f_{G3}/f_{G2}|$ for the fourth embodiment shown in FIG. 4A is 4.64.

FIG. 4B shows the ray aberrations of the projection lens system of the fourth embodiment for varying relative field heights at a wavelength of 248.4 nanometers.

Figure 4C:
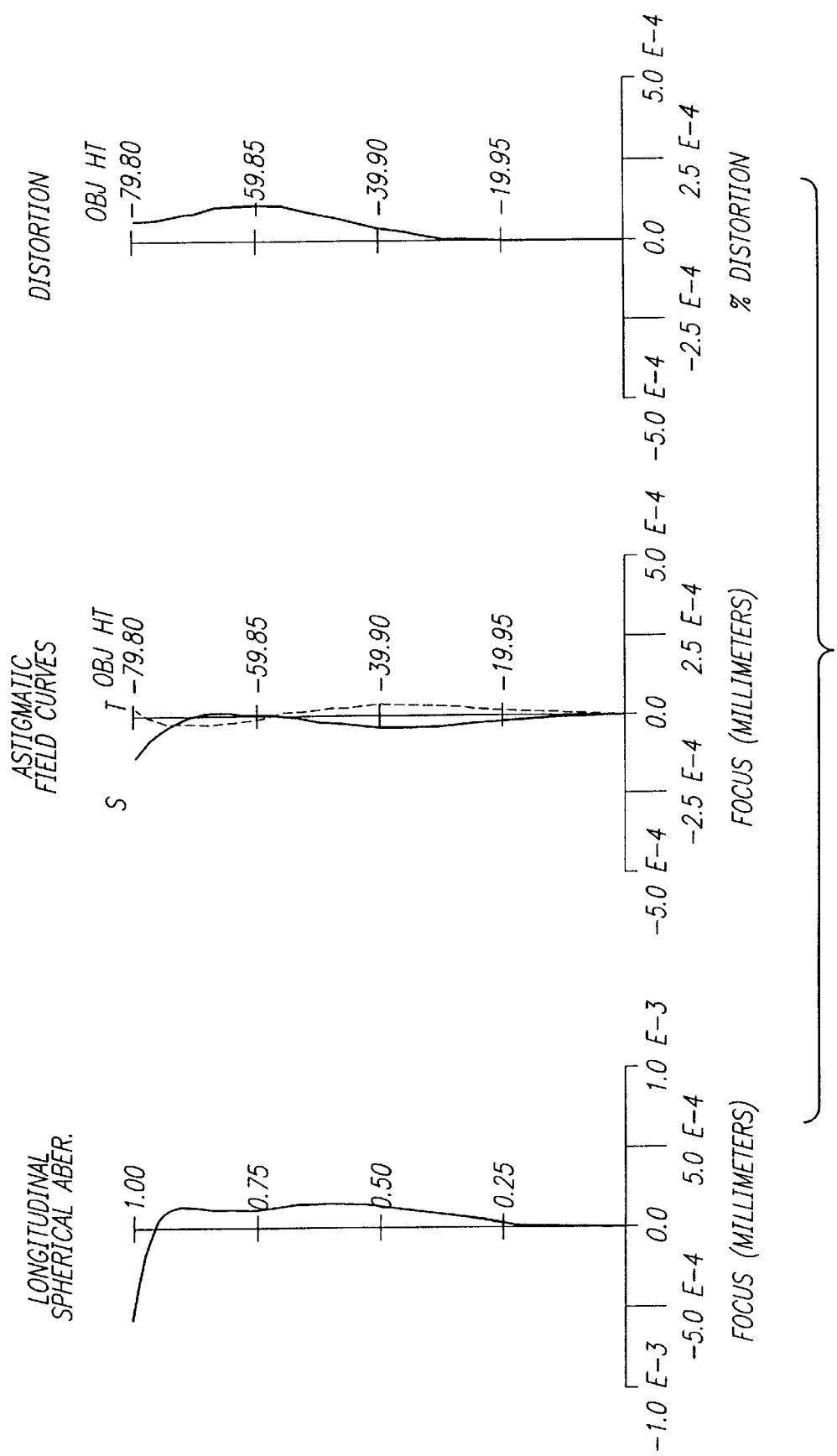
FIG. 4C shows the longitudinal spherical aberration, the astigmatic field curves, and the distortion of the projection lens system shown in FIG. 4A.

FIG. 4C shows the longitudinal spherical aberration, the astigmatic field curves, and the distortion of the projection lens system of the fourth embodiment.

The significance of the ray aberration diagrams, astigmatic field curves and distortion shown n FIGS. 4B & 4C is described above in relation to the discussion of FIGS. 1B & 1C.

Table 4 below shows the values of specifications for the fourth embodiment described above. The parameters are the same as described above for Table 1.

TABLE 4

Object plane to first optical surface = 93.018166 mm
Last optical surface to image plane = 14.592194 mm
$f_{G1}$ = 188.60 mm, $f_{G2}$ = −285.282 mm, $f_{G3}$ = 1322.986 mm,
$f_{G4}$ = 164.88 mm
$f_{ap}$ = −1019.34 mm, $q_{ap}$ = 0.1673, F = 529.61 mm, L = 1250 mm.
Refractive index of all glass elements = 1.508379 at a wavelength of 248.4 nanometers.
NA = 0.73, 6X Reduction, Exposure field size = 26.6 mm diameter

| Surface number | Radius of curvature (mm) | Axial distance (mm) | Optical material |
|---|---|---|---|
| OBJ | INFINITY | 93.018166 | |
| 1 | INFINITY | 25.188902 | silica |
| 2 | −836.21440 | 5.955046 | air |
| 3 | 1911.64782 | 25.001126 | silica |
| 4 | −980.29408 | 7.199076 | air |
| 5 | 724.74283 | 27.025048 | silica |
| 6 | −425.71352 | 8.253075 | air |
| 7 | 1732.84484 | 28.308821 | silica |
| 8 | 2156.38721 | 6.911263 | air |
| 9 | 274.57266 | 27.299345 | silica |
| 10 | −701.08185 | 1.254086 | air |
| 11 | 587.17694 | 18.000000 | silica |
| 12 | 132.14693 | 29.898912 | air |
| 13 | −236.92794 | 15.000000 | silica |
| 14 | 205.60066 | 36.332079 | air |
| 15 | −797.94478 | 15.000000 | silica |

TABLE 4-continued

Object plane to first optical surface = 93.018166 mm
Last optical surface to image plane = 14.592194 mm
$f_{G1}$ = 188.60 mm, $f_{G2}$ = -285.282 mm, $f_{G3}$ = 1322.986 mm,
$f_{G4}$ = 164.88 mm
$f_{ap}$ = -1019.34 mm, $q_{ap}$ = 0.1673, F = 529.61 mm, L = 1250 mm.
Refractive index of all glass elements = 1.508379 at a wavelength of 248.4 nanometers.
NA = 0.73, 6X Reduction, Exposure field size = 26.6. mm diameter

| Surface number | Radius of curvature (mm) | Axial distance (mm) | Optical material |
|---|---|---|---|
| 16 | 179.43891 | 35.754563 | air |
| 17 | -154.20559 | 18.000000 | silica |
| 18 | -911.37773 | 11.369718 | air |
| 19 | -280.44241 | 30.654295 | silica |
| 20 | -195.60995 | 2.091399 | air |
| 21 | -6648.19419 | 29.193838 | silica |
| 22 | -322.97879 | 1.286829 | air |
| 23 | 1189.61530 | 35.852434 | silica |
| 24 | -323.97408 | 1.000199 | air |
| 25 | 1105.22955 | 28.631753 | silica |
| 26 | -514.11850 | 1.000208 | air |
| 27 | 268.55323 | 25.000062 | silica |
| 28 | 696.79800 | 1.000000 | air |
| 29 | 181.99093 | 39.946087 | silica |
| 30 | 328.60609 | 5.667799 | air |
| 31 | 498.23912 | 20.000000 | silica |
| 32 | 127.73538 | 35.789894 | air |
| 33 | -286.14950 | 15.000000 | silica |
| 34 | 185.79200 | 43.739207 | air |
| 35 | -131.11685 | 20.000000 | silica |
| 36 | -2707.70296 | 14.398810 | air |
| 37 | -448.62719 | 51.458042 | silica |
| 38 | -199.64363 | 24.725376 | air |
| 39 (STOP) | INFINITY | 10.178834 | air |
| 40 | INFINITY | 34.031239 | silica |
| 41 | -336.88921 | 1.001916 | air |
| 42 | 2489.28283 | 27.886559 | silica |
| 43 | -568.31688 | 1.000000 | air |
| 44 | 493.91664 | 25.001188 | silica |
| 45 | 245.83233 | 8.990270 | air |
| 46 | 306.42712 | 55.523092 | silica |
| 47 | -478.77020 | 1.000066 | air |
| 48 | 262.84040 | 29.618410 | silica |
| 49 | 683.83171 | 1.000021 | air |
| 50 | 155.92064 | 32.547455 | silica |
| 51 | 255.17935 | 1.000249 | air |
| 52 | 90.16409 | 43.474484 | silica |
| 53 | 64.32039 | 31.513226 | air |
| 54 | 152.67222 | 25.232236 | silica |
| 55 | INFINITY | 1.000117 | air |
| 56 | 949.82698 | 12.500000 | silica |
| 57 | 57.23525 | 1.000587 | air |
| 58 | 51.10929 | 30.702088 | silica |
| 59 | 3126.64885 | 14.592194 | air |
| IMG | INFINITY | 0.000000 | |

The parameter definitions for Table 4 are the same as described above for Table 1.

Figure 5A:
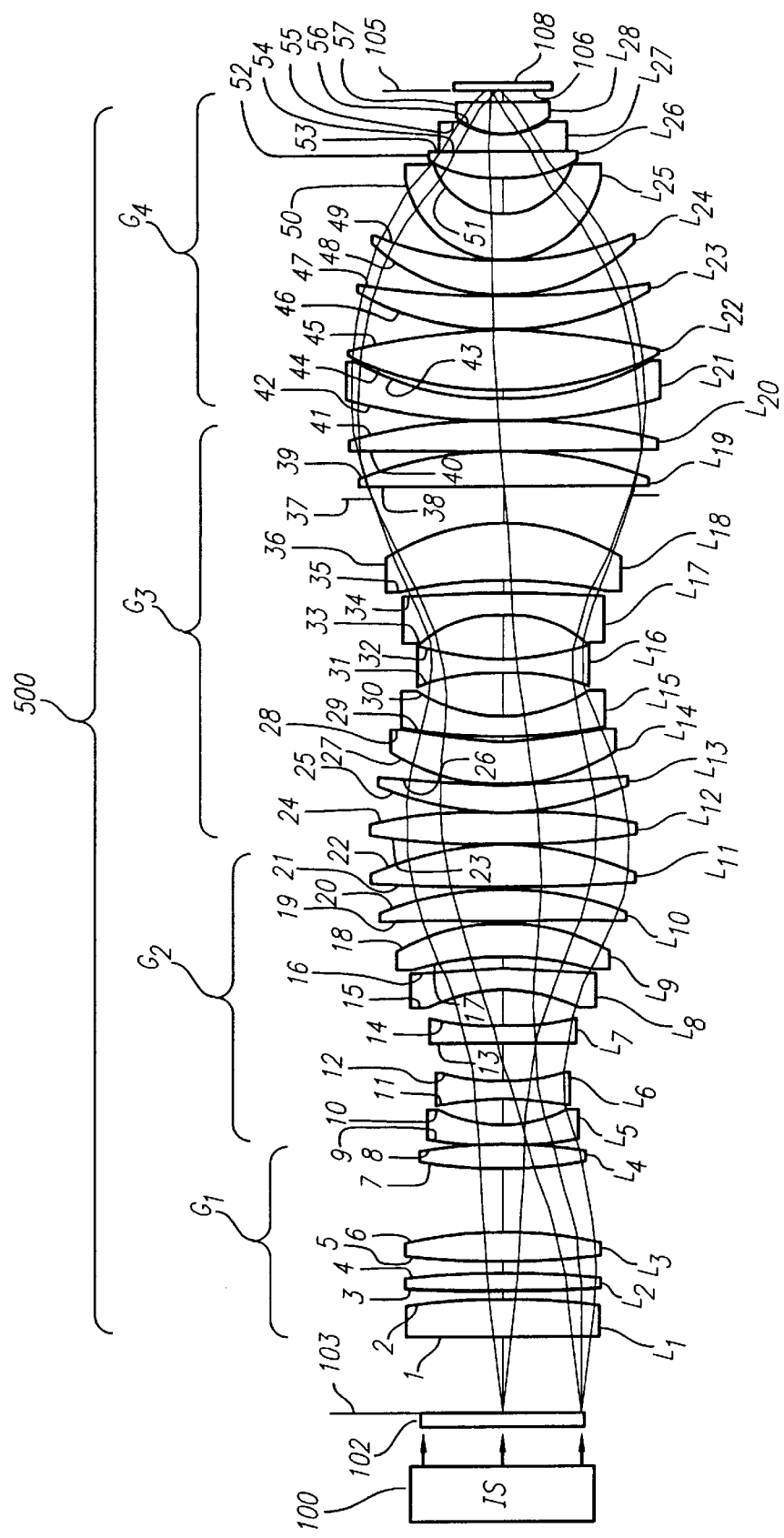
FIG. 5A is a schematic diagram of a projection lens system according to a fifth embodiment of the present invention.

Referring to FIG. 5A, a fifth embodiment of a projection lens system in accordance with the present invention is shown. The projection lens system 500, viewed from the object side, in order of succession, includes a first group of lens elements $G_1$ with an overall positive refractive power, a second group of lens elements $G_2$ with an overall negative refractive power, a third group of lens elements $G_3$ with an overall positive refractive power, and a fourth group of lens elements $G_4$ with an overall positive refractive power. An aperture stop 37 is disposed in the third group of lens elements $G_3$. The fourth group of lens elements $G_4$ includes an aplanatic lens element $L_{25}$ and a lens triplet with lens elements $L_{26}$, $L_{27}$, and $L_{28}$. The fourth group of lens elements $G_4$ includes meniscus lens $L_{21}$, $L_{23}$, $L_{24}$, $L_{25}$, $L_{27}$, and $L_{28}$ all having the concave surface facing the image side.

The aplanatic lens element $L_{24}$ satisfies the following condition:

$$0.1 < q_{ap} < 0.224,$$

where the shape factor $q_{ap}=(R_1-R_2)/(R_1+R_2)$ where $R_1$ is the radius of curvature of the lens surface facing the reticle side of the optical lens system and $R_2$ is the radius of curvature of the lens surface facing the image side of the optical lens system. The inequality $0.1<q_{ap}<0.224$ can be expressed in terms of the radii $R_1$ and $R_2$ of the aplanatic lens where $R_1$ and $R_2$ both have positive radii and $R_1>R_2$. The inequality $0.1<q_{ap}<0.224$ is equivalent to $1.222<R_1/R_2<1.57732$. Therefore, the inequality $1.222<R_1/R_2$ corresponds to $0.1<q_{ap}$ and $R_1/R_2<1.57732$ corresponds to $q_{ap}<0.224$ and these further imply that if $q_{ap}$ is above the upper limit of the inequality $0.1<q_{ap}<0.224$, the negative refractive power aplanatic lens element will have a stronger radius and have larger contributions to higher order aberrations. If $q_{ap}$ is below the lower limit of the inequality $0.1<q_{ap}<0.224$, the dioptric power of the aplanatic lens will approach zero or that of a parallel plate, which would not be effective in balancing aberrations since the radius $R_2$ will approach the value of $R_1$ as $R_1/R_2$ approaches unity. The shape factor for the fifth embodiment shown in FIG. 5A is equal to 0.1667.

The optical lens system also satisfies the following condition:

$$-2.0 < f_{ap}/F < -0.6251,$$

where $f_{ap}$ is the focal length of the aplanatic lens element and F is the focal length of the optical lens system. If $f_{ap}/F$ is above the upper limit of the inequality, the aplanatic lens element will have a stronger dioptric power since the focal length is shorter and it will have larger higher order aberrations. If $f_{ap}/F$ is below the lower limit, the aplanatic lens element will have a long focal length and will be less effective in balancing aberrations for the entire system. The value $f_{ap}/F$ for the fifth embodiment shown in FIG. 5A is -1.6826.

The optical lens system further satisfies the following condition:

$$2.6 < |f_{G3}/f_{G2}| < 4.64,$$

where $f_{G2}$ is the focal length of the second group of lens elements and $f_{G3}$ is the focal length of the third group of lens elements. If $|f_{G3}/f_{G2}|$ is below 2.6 the field dependent aberrations, coma, distortion, and astigmatism, are more difficult to correct. If $|f_{G3}/f_{G2}|$ is above 4.64, spherical aberration is more difficult to correct although the field dependent aberrations are easier to correct. In addition, if $|f_{G3}/f_{G2}|$ is outside the above limits, the diameter of the lens elements in the third group of lens elements is too large causing mechanical problems relating to the structure necessary to support the large diameter lens elements. The value $|f_{G3}/f_{G2}|$ for the fifth embodiment shown in FIG. 5A is 3.67.

FIG. 5B shows the ray aberrations of the projection lens system of the second embodiment for varying relative field heights at a wavelength of 248.4 nanometers.

Figure 5C:
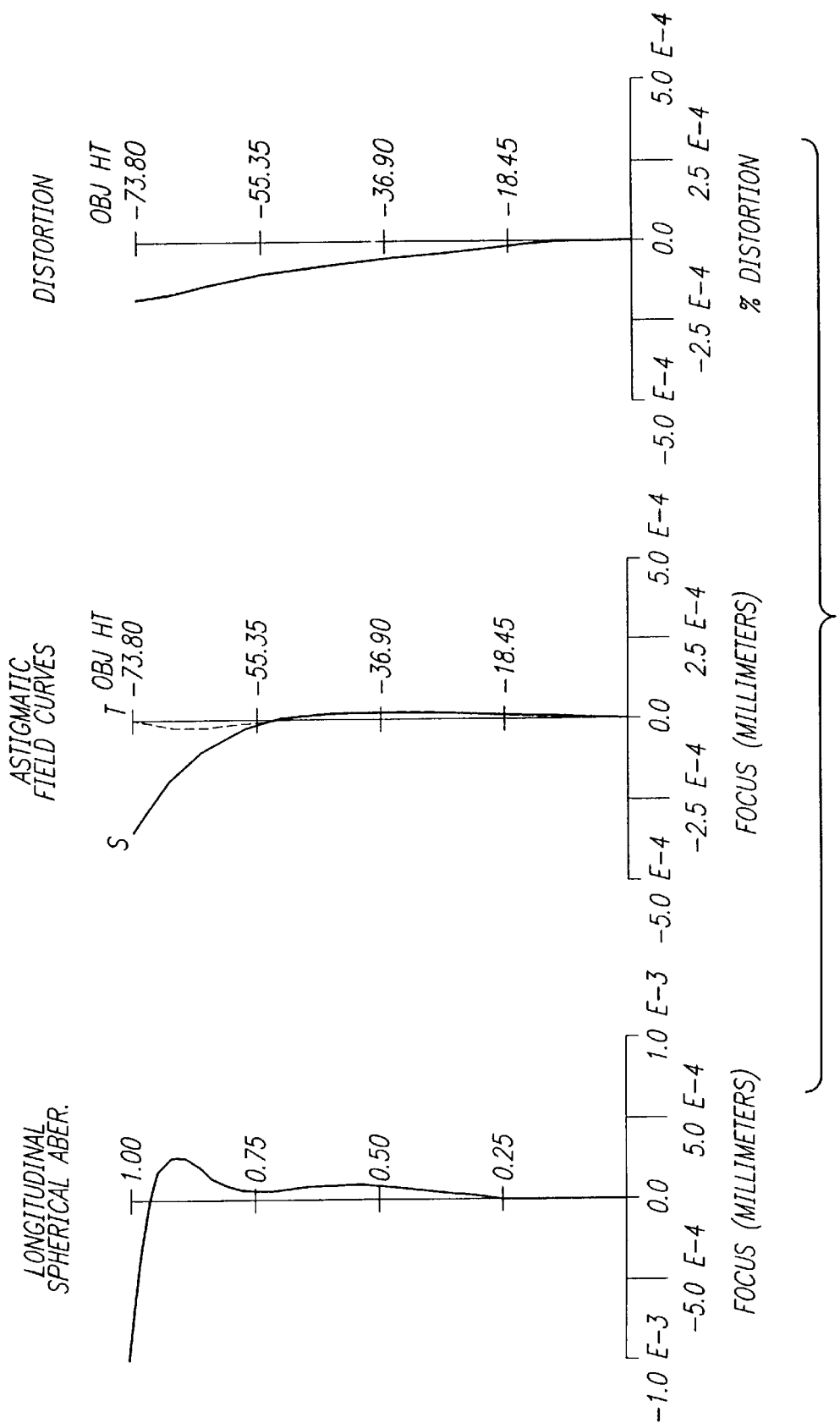
FIG. 5C shows the longitudinal spherical aberration, the astigmatic field curves, and the distortion of the projection lens system shown in FIG. 5A.

FIG. 5C shows the longitudinal spherical aberration, the astigmatic field curves, and the distortion of the projection lens system of the fifth embodiment.

The significance of the ray aberration diagrams, astigmatic field curves and distortion shown in FIGS. 5B & 5C is described above in relation to the discussion of FIGS. 1B & 1C.

Table 5 below shows the values of specifications for the fifth embodiment described above. The parameters are the same as described above for Table 1.

TABLE 5

Object plane to first optical surface = 71.016502 mm
Last optical surface to image plane = 13.017161 mm
$f_{G1}$ = 208.74 mm, $f_{G2}$ = −391.10 mm, $f_{G3}$ = 1435.17 mm,
$f_{G4}$ = 164.60 mm
$f_{ap}$ = −1013.80 mm, $q_{ap}$ = 0.1667, F = 602.52 mm, L = 1250 mm.
Refractive index of all glass elements = 1.508379 at a wavelength of 248.4 nanometers
NA = 0.75, 6X Reduction, Exposure field size = 24.6 mm diameter.

| Surface number | Radius curvature (mm) | Axial distance (mm) | material |
|---|---|---|---|
| OBJ | INFINITY | 71.016502 | |
| 1 | −3338.89001 | 33.440578 | silica |
| 2 | −931.26440 | 8.077128 | air |
| 3 | 1245.87524 | 18.150612 | silica |
| 4 | −744.70563 | 11.500645 | air |
| 5 | 832.60043 | 26.814523 | silica |
| 6 | −416.15394 | 60.350391 | air |
| 7 | 384.62746 | 21.466492 | silica |
| 8 | −587.15594 | 1.089732 | air |
| 9 | 441.01405 | 18.000000 | silica |
| 10 | 129.05904 | 25.930803 | air |
| 11 | −232.69179 | 15.000000 | silica |
| 12 | 183.05790 | 36.840682 | air |
| 13 | −917.27699 | 15.000000 | silica |
| 14 | 238.16579 | 36.625151 | air |
| 15 | −152.52785 | 18.000000 | silica |
| 16 | −1046.99539 | 12.218797 | air |
| 17 | −302.65810 | 31.044362 | silica |
| 18 | −198.20593 | 2.963764 | air |
| 19 | −7370.05267 | 29.309043 | silica |
| 20 | −320.66612 | 1.000236 | air |
| 21 | 1834.94337 | 39.804199 | silica |
| 22 | −283.31357 | 1.000226 | air |
| 23 | 702.91397 | 31.346751 | silica |
| 24 | −632.61150 | 1.000595 | air |
| 25 | 275.26836 | 23.703982 | silica |
| 26 | 596.24592 | 1.053730 | air |
| 27 | 179.64731 | 39.202258 | silica |
| 28 | 296.11630 | 6.058015 | air |
| 29 | 425.16670 | 20.000000 | silica |
| 30 | 129.92978 | 39.141856 | air |
| 31 | −264.40669 | 15.000000 | silica |
| 32 | 188.84477 | 40.712050 | air |
| 33 | −137.73996 | 20.000000 | silica |
| 34 | −4161.43153 | 13.590591 | air |
| 35 | −446.12102 | 51.921150 | silica |
| 36 | −205.56137 | 24.603102 | air |
| 37 (STOP) | INFINITY | 10.199246 | air |
| 38 | −43575.40387 | 34.491487 | silica |
| 39 | −347.78848 | 1.000611 | air |
| 40 | 1716.00967 | 30.282995 | silica |
| 41 | −583.94661 | 1.000000 | air |
| 42 | 502.57123 | 18.000000 | silica |
| 43 | 251.51241 | 9.555855 | air |
| 44 | 311.10062 | 58.377416 | silica |
| 45 | −477.56182 | 1.020901 | air |
| 46 | 255.98196 | 32.102703 | silica |
| 47 | 714.08305 | 1.000511 | air |
| 48 | 161.75319 | 32.376955 | silica |
| 49 | 264.19226 | 1.000000 | air |
| 50 | 89.01024 | 42.876801 | silica |
| 51 | 63.57882 | 31.802371 | air |
| 52 | 155.74622 | 23.957055 | silica |
| 53 | −4223.48247 | 1.000102 | air |
| 54 | 1653.47339 | 12.500000 | silica |
| 55 | 58.83075 | 1.000000 | air |
| 56 | 51.61167 | 31.453942 | silica |
| 57 | 2904.36295 | 13.017161 | air |
| IMG | INFINITY | 0.000000 | |

The parameter definitions for Table 5 are the same as described above for Table 1.

Figure 6A:
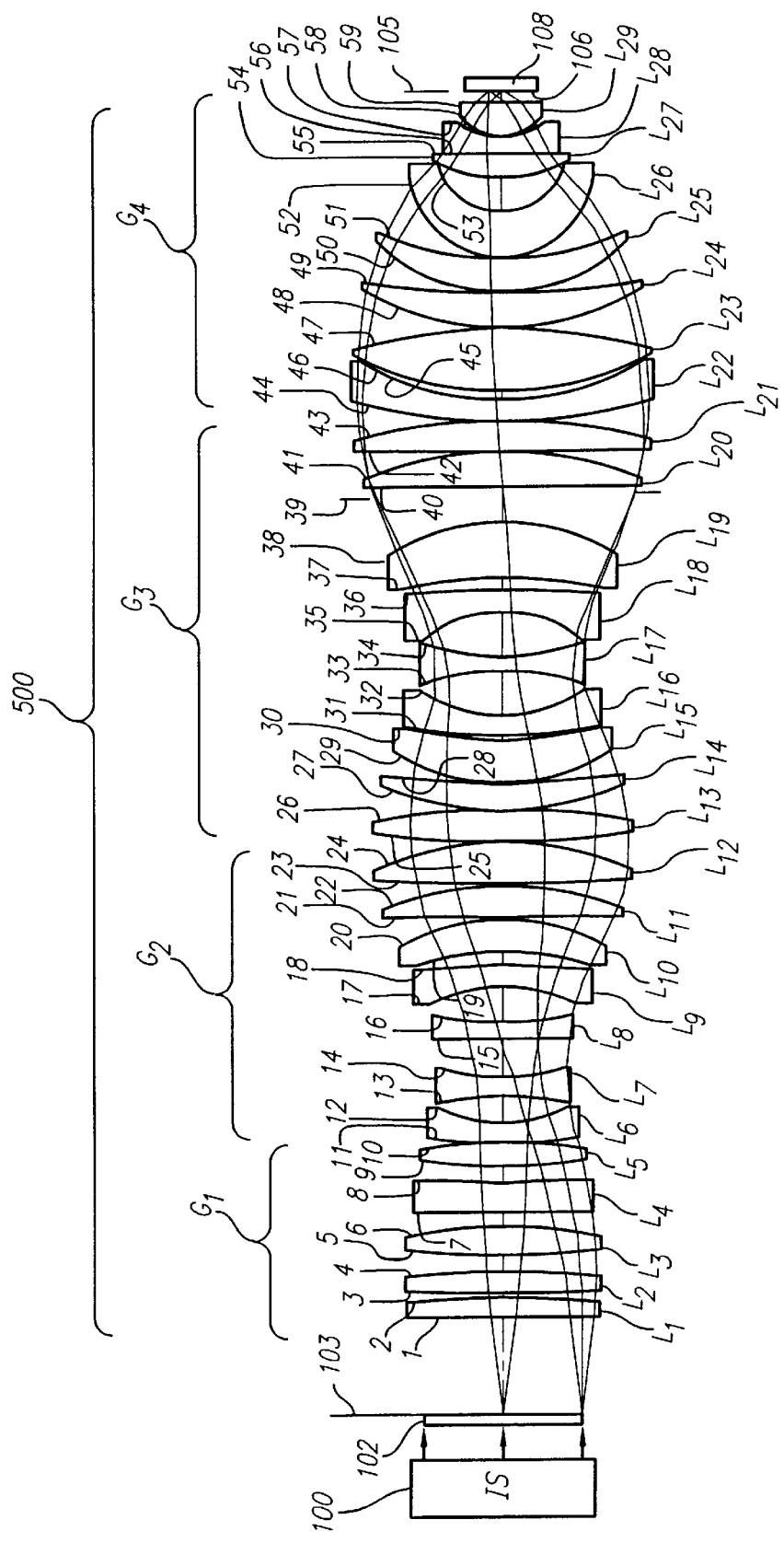
FIG. 6A is a schematic diagram of a projection lens system according to a sixth embodiment of the present invention.

Referring to FIG. 6A, a sixth embodiment of a projection lens system in accordance with the present invention is shown. The projection lens system 600, viewed from the objet side, in order of succession, includes a first group of lens elements $G_1$ with an overall positive refractive power, a second group of lens elements $G_2$ with an overall negative refractive power, a third group of lens elements $G_3$ with an overall positive refractive power, and a fourth group of lens elements $G_4$ with overall positive refractive power. An aperture stop 39 is disposed in the third group of lens elements $G_3$. The fourth group of lens elements $G_4$ includes an aplanatic lens element $L_{26}$ and lens triplet with lens elements $L_{27}$, $L_{28}$, and $L_{29}$. The fourth group of lens elements $G_4$ includes meniscus lens elements $L_{22}$, $L_{24}$, $L_{25}$, $L_{26}$, $L_{28}$, and $L_{29}$ all having the concave surface facing the image side.

The aplanatic lens element $L_{24}$ satisfies the following condition:

$$0.1 < q_{ap} < 0.224,$$

where the shape factor $q_{ap} = (R_1 - R_2)/(R_1 + R_2)$ where $R_1$ is the radius of curvature of the lens surface facing the reticle side of the optical lens system and $R_2$ is the radius of curvature of the lens surface facing the image side of the optical lens system. The inequality $0.1 < q_{ap} < 0.224$ can be expressed in terms of the radii $R_1$ and $R_2$ of the aplanatic lens where $R_1$ and $R_2$ both have positive radii and $R_1 > R_2$. The inequality $0.1 < q_{ap} < 0.224$ is equivalent to $1.222 < R_1/R_2 < 1.57732$. Therefore, the inequality $1.222 < R_1/R_2$ corresponds to $0.1 < q_{ap}$ and $R_1/R_2 < 1.57732$ corresponds to $q_{ap} < 0.224$ and these further imply that if $q_{ap}$ is above the upper limit of the inequality $0.1 < q_{ap} < 0.224$, the negative refractive power aplanatic lens element will have a stronger radius and larger contributions to higher order aberrations. If $q_{ap}$ is below the lower limit of the inequality $0.1 < q_{ap} < 0.224$, the dioptric power of the aplanatic lens will approach zero or that of a parallel plate, which would not be effective in balancing aberrations since the radius $R_2$ will approach the value of $R_1$ as $R_1/R_2$ approaches unity. The shape factor for the sixth embodiment shown in FIG. 6A is equal to 0.1667.

The optical lens system also satisfies the following condition:

$$-2.0 < f_{ap}/F < -0.6251,$$

where $f_{ap}$ is the focal length of the aplanatic lens element and F is the focal length of the optical lens system. If $f_{ap}/F$ is above the upper limit of the inequality, the aplanatic lens element will have a stronger dioptric power since the focal length is shorter and it will have larger higher order aberrations. If $f_{ap}/F$ is below the lower limit, the aplanatic lens element will have a long focal length and will be less effective in balancing aberrations for the entire system. The value $f_{ap}/F$ for the sixth embodiment shown in FIG. 6A is −986.55.

The optical lens system further satisfies the following condition:

$$2.6 < |f_{G3}/f_{G2}| < 4.64,$$

where $f_{G2}$ is the focal length of the second group of lens elements and $f_{G3}$ is the focal length of the third group of lens elements. If $|f_{G3}/f_{G2}|$ is below 2.6 the field dependent aberrations, coma, distortion, and astigmatism, are more difficult to correct. If $|f_{G3}/f_{G2}|$ is above 4.64, spherical aberration is more difficult to correct although the field dependent aberrations are easier to correct. In addition, if $|f_{G3}/f_{G2}|$ is outside the above limits, the diameter of the lens elements in the third group of lens elements is too large causing mechanical problems relating to the structure necessary to support the large diameter lens elements. The value $|f_{G3}/f_{G2}|$ for the sixth embodiment shown in FIG. 6A is 4.46.

FIG. 6B shows the ray aberrations of the projection lens system of the sixth embodiment for varying relative field heights at a wavelength of 248.4 nanometers.

Figure 6C:
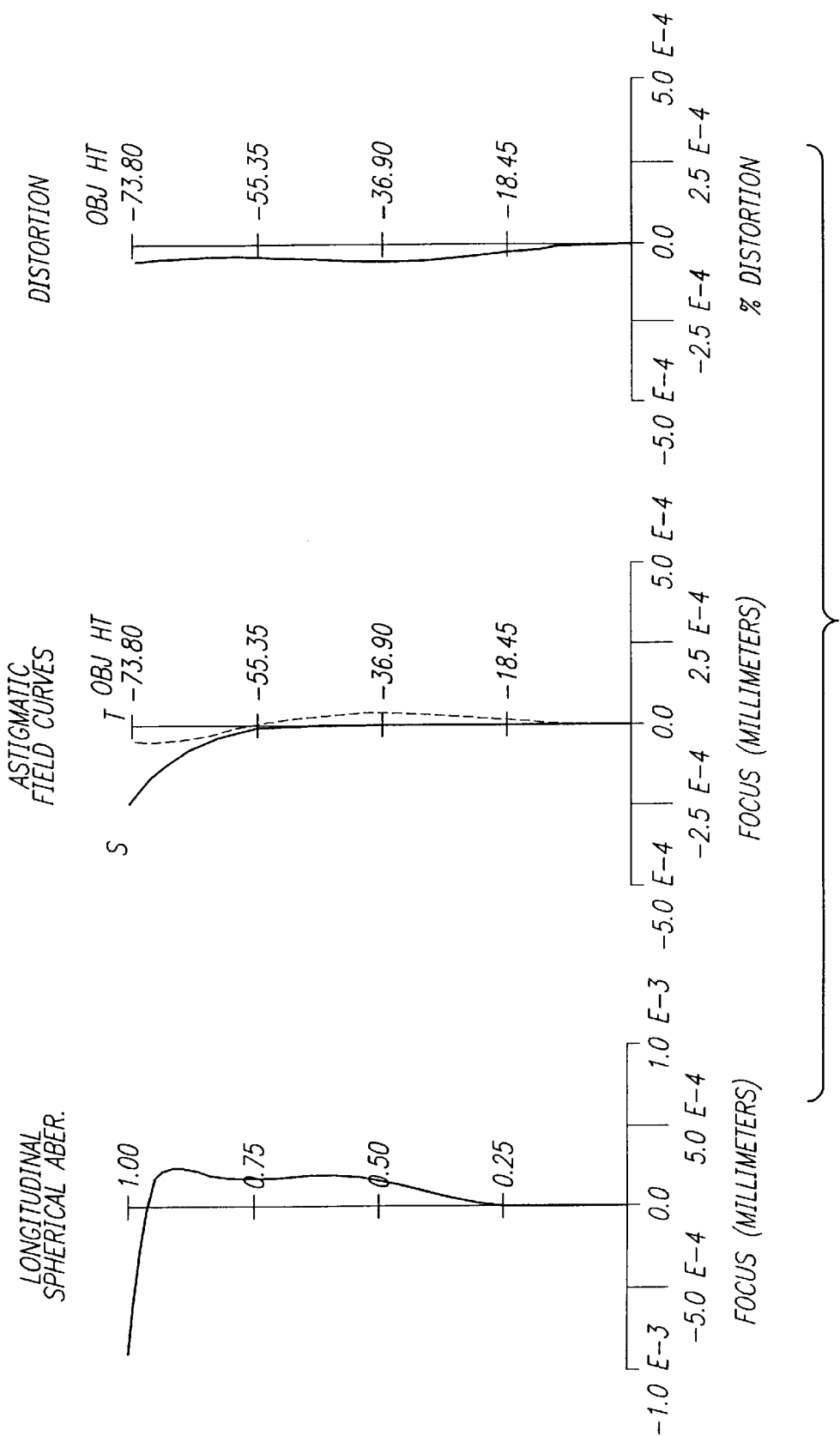
FIG. 6C shows the longitudinal spherical aberration, the astigmatic field curves, and the distortion of the projection lens system shown in FIG. 6A.

FIG. 6C shows the longitudinal spherical aberration, the astigmatic field curves, and the distortion of the projection lens system of the sixth embodiment.

The significance of the ray aberration diagrams, astigmatic field curves and distortion shown in FIGS. 6A & 6B.

TABLE 6

Object plane to first optical surface = 89.999552 mm
Last optical surface to image plane = 12.990918 mm
$f_{G1}$ = 190.45 mm, $f_{G2}$ = −335.726 mm, $f_{G3}$ = 1498.13 mm,
$f_{G4}$ = 163.82 mm
$f_{ap}$ = −986.55 mm, $q_{ap}$ = 0.1667, F = 522.56 mm, L = 1250 mm
Refractive index of all glass elements = 1.508379 at a wavelength of 248.4 nanometers
NA = 0.75, 6X Reduction, Exposure field size = 24.6 mm diameter

| Surface number | Radius of curvature (mm) | Axial distance (mm) | Optical material |
|---|---|---|---|
| OBJ | INFINITY | 89.999552 | |
| 1 | INFINITY | 18.000000 | silica |
| 2 | −745.29040 | 5.097160 | air |
| 3 | 2342.00009 | 19.125028 | silica |
| 4 | −854.70979 | 12.825201 | air |
| 5 | 817.57896 | 30.207887 | silica |
| 6 | −414.93378 | 10.871081 | air |
| 7 | 2039.05662 | 28.226525 | silica |
| 8 | 2818.69100 | 9.454032 | air |
| 9 | 285.05581 | 25.927719 | silica |
| 10 | −665.84767 | 1.000000 | air |
| 11 | 767.78583 | 18.000000 | silica |
| 12 | 132.37008 | 27.955235 | air |
| 13 | −236.86721 | 15.000000 | silica |
| 14 | 191.25161 | 37.928806 | air |
| 15 | −791.09721 | 15.000000 | silica |
| 16 | 224.59475 | 37.929917 | air |
| 17 | −157.04025 | 18.000000 | silica |
| 18 | −1079.53655 | 11.826387 | air |
| 19 | −294.54443 | 30.769347 | silica |
| 20 | −201.06562 | 2.592464 | air |
| 21 | −9677.04152 | 29.267049 | silica |
| 22 | −319.51813 | 1.007060 | air |
| 23 | 1962.23970 | 39.738084 | silica |
| 24 | −283.60825 | 1.000000 | air |
| 25 | 695.46761 | 31.057099 | silica |
| 26 | −659.58952 | 1.000000 | air |
| 27 | 278.17502 | 23.575259 | silica |
| 28 | 601.73767 | 1.000000 | air |
| 29 | 179.36905 | 39.079209 | silica |
| 30 | 315.04616 | 5.874136 | air |
| 31 | 456.40944 | 20.000000 | silica |
| 32 | 130.01252 | 39.099604 | air |
| 33 | −268.44922 | 15.000000 | silica |
| 34 | 187.75455 | 40.877553 | air |
| 35 | −136.60523 | 20.000000 | silica |
| 36 | −4331.45504 | 13.651359 | air |
| 37 | −453.60931 | 51.999923 | silica |
| 38 | −203.41377 | 24.843442 | air |
| 39 (STOP) | INFINITY | 10.000000 | air |
| 40 | INFINITY | 34.378807 | silica |
| 41 | −348.92340 | 1.000000 | air |
| 42 | 2057.12906 | 29.336095 | silica |
| 43 | −580.91177 | 1.000000 | air |
| 44 | 496.18013 | 18.000000 | silica |
| 45 | 251.86125 | 8.953525 | air |
| 46 | 310.44638 | 58.642212 | silica |
| 47 | −467.65134 | 1.000000 | air |
| 48 | 259.50668 | 31.108896 | silica |
| 49 | 680.82655 | 1.000000 | air |
| 50 | 157.96591 | 33.020975 | silica |
| 51 | 257.65307 | 1.000000 | air |
| 52 | 88.77525 | 43.133057 | silica |
| 53 | 63.07355 | 32.135146 | air |
| 54 | 144.71375 | 24.132059 | silica |
| 55 | −5976.83822 | 1.000000 | air |
| 56 | 1704.01504 | 12.500000 | silica |

TABLE 6-continued

Object plane to first optical surface = 89.999552 mm
Last optical surface to image plane = 12.990918 mm
$f_{G1}$ = 190.45 mm, $f_{G2}$ = −335.726 mm, $f_{G3}$ = 1498.13 mm,
$f_{G4}$ = 163.82 mm
$f_{ap}$ = −986.55 mm, $q_{ap}$ = 0.1667, F = 522.56 mm, L = 1250 mm
Refractive index of all glass elements = 1.508379 at a wavelength of 248.4 nanometers
NA = 0.75, 6X Reduction, Exposure field size = 24.6 mm diameter

| Surface number | Radius of curvature (mm) | Axial distance (mm) | Optical material |
|---|---|---|---|
| 57 | 55.24015 | 1.000000 | air |
| 58 | 49.37543 | 30.861956 | silica |
| 59 | 2613.32600 | 12.990918 | air |
| IMG | INFINITY | 0.000000 | |

The parameter definitions for Table 6 are the same as described above for Table 1.

In summary, the results and advantages of the present invention are obtained by projection lens systems each having large numerical apertures and large exposure field sizes at the wafer plane with good aberration correction. The projection lens systems include an aplanatic lens element that does not contribute to the third order spherical and coma aberrations of the projection lens systems and helps balance the overall system aberrations and improves the overall system performance.

The foregoing description of the embodiments of the invention has been presented for purposes of illustration and description. It is not intended to be exhaustive or to limit the invention to the precise form disclosed. Obvious modifications or variations are possible in light of the above teachings. The embodiments were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A projection exposure apparatus for transferring a pattern on a reticle onto a wafer, the apparatus comprising a projection optical lens system comprising in order from an object side to an image side:

a first group of lens elements having a positive refractive power;

a second group of lens elements having a negative refractive power;

a third group of lens elements having a positive refractive power; and a fourth group of lens elements having a positive refractive power, the fourth group of lens elements including a substantially aplanatic lens element.

2. The projection exposure apparatus of claim 1 wherein the substantially aplanatic lens element satisfies the following condition:

$$0.1 < (R_1 - R_2)/(R_1 + R_2) < 0.224,$$

where $R_1$ is the radius of curvature of a surface of the substantially aplanatic lens element facing an object side of the projection optical lens system and $R_2$ is the radius of curvature of a surface of the substantially aplanatic lens element facing an image side of the projection optical lens system.

3. The projection exposure apparatus of claim 2 wherein the projection optical lens system satisfies the following condition:

$$-2.0 < f_{ap}/F < -0.6251,$$

where $f_{ap}$ is a focal length of the aplanatic lens element and F is the focal length of the projection optical lens system.

4. The projection exposure apparatus of claim 1 wherein the projection optical lens system satisfies the following condition:

$$2.6 < |f_{G3}/f_{G2}| < 4.64,$$

where $f_{G2}$ is the focal length of the second group of lens elements and $f_{G3}$ is the focal length of the third group of lens elements.

5. The projection exposure apparatus of claim 4 wherein the fourth group of lens elements includes at least one meniscus lens element having a concave surface facing the image side.

6. The projection exposure apparatus of claim 5 wherein the fourth group of lens elements includes more than one meniscus lens element each having a concave surface facing the image side.

7. The projection exposure apparatus of claim 6 wherein the substantially aplanatic lens element is a meniscus lens element having a negative refractive power.

8. The projection exposure apparatus of claim 7 wherein the fourth group of lens elements include a triplet sub-group of lens elements made up of a lens element having a positive refractive power, a lens element having a negative refractive power, and a lens element having a positive refractive power.

9. The projection exposure apparatus of claim 1 wherein the projection optical lens system satisfies the following condition:

$$-2.0 < f_{ap}/F < -0.6251,$$

where $f_{ap}$ is a focal length of the substantially aplanatic lens element and F is focal length of the projection optical lens system.

* * * * *